(12) United States Patent
Peng

(10) Patent No.: US 10,790,323 B2
(45) Date of Patent: Sep. 29, 2020

(54) SEMICONDUCTOR DEVICE PACKAGES AND METHODS OF MANUFACTURING THE SAME

(71) Applicant: Advanced Semiconductor Engineering, Inc., Kaohsiung (TW)

(72) Inventor: Yu-Min Peng, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/287,970

(22) Filed: Feb. 27, 2019

(65) Prior Publication Data

US 2019/0267417 A1 Aug. 29, 2019

Related U.S. Application Data

(60) Provisional application No. 62/635,912, filed on Feb. 27, 2018.

(51) Int. Cl.
*H01L 27/146* (2006.01)
*G06K 9/00* (2006.01)

(52) U.S. Cl.
CPC .. *H01L 27/14618* (2013.01); *H01L 27/14623* (2013.01); *H01L 27/14625* (2013.01); *H01L 27/14629* (2013.01); *H01L 27/14685* (2013.01); *G06K 9/00013* (2013.01)

(58) Field of Classification Search
None
See application file for complete search history.

(56) References Cited

U.S. PATENT DOCUMENTS

| 2006/0014314 A1* | 1/2006 | Yaung | H01L 27/1462 438/69 |
| 2007/0023799 A1* | 2/2007 | Boettiger | H01L 27/14625 257/292 |
| 2012/0003782 A1* | 1/2012 | Byun | H01L 27/14625 438/72 |

* cited by examiner

*Primary Examiner* — Herve-Louis Y Assouman
(74) *Attorney, Agent, or Firm* — Foley & Lardner LLP

(57) ABSTRACT

A semiconductor device package includes a semiconductor device, an optical conductive pillar, a first encapsulant and a second encapsulant. The semiconductor device includes a pixel. The optical conductive pillar is disposed on the pixel. The first encapsulant has a first thickness and encapsulates the optical conductive pillar. The second encapsulant has a second thickness different from the first thickness.

17 Claims, 31 Drawing Sheets

SEMICONDUCTOR DEVICE PACKAGES AND METHODS OF MANUFACTURING THE SAME

CROSS-REFERENCE TO RELATED APPLICATIONS

This application claims the benefit of and priority to U.S. Provisional Application No. 62/635,912, filed Feb. 27, 2018, the entire contents of which are incorporated herein by reference.

BACKGROUND

1. Technical Field

The present disclosure relates to a semiconductor device package and a method for manufacturing the semiconductor device package, and more particularly to a semiconductor device package including a semiconductor device and a protection layer on the semiconductor device.

2. Description of the Related Art

A comparative semiconductor device package may include a collimator on each of the pixels. However, an electrical area (or a bonding area) of the semiconductor device package may be damaged or polluted during the manufacturing operations. An improved semiconductor device package and the manufacturing operations are thus needed.

SUMMARY

In accordance with some embodiments of the present disclosure, a semiconductor device package includes a semiconductor device, an optical conductive pillar, a first encapsulant and a second encapsulant. The semiconductor device includes a pixel. The optical conductive pillar is disposed on the pixel. The first encapsulant has a first thickness and encapsulates the optical conductive pillar. The second encapsulant has a second thickness different from the first thickness.

In accordance with some embodiments of the present disclosure, a semiconductor device package includes a semiconductor device, an optical conductive pillar, an encapsulant and a wall. The semiconductor device includes a pixel. The optical conductive pillar is disposed on the pixel. The encapsulant has a first thickness and encapsulates the optical conductive pillar. The wall has a second thickness different from the first thickness.

In accordance with some embodiments of the present disclosure, a method for manufacturing a semiconductor device package includes providing a semiconductor device including a pixel; disposing an optical conductive pillar on the pixel; forming an encapsulant having a first thickness, wherein the encapsulant encapsulates the optical conductive pillar; forming a wall having a second thickness different from the first thickness.

BRIEF DESCRIPTION OF THE DRAWINGS

Aspects of the present disclosure are readily understood from the following detailed description when read with the accompanying drawings. It is noted that various features may not be drawn to scale, and the dimensions of the various features may be arbitrarily increased or reduced for clarity of discussion.

Figure 1A:
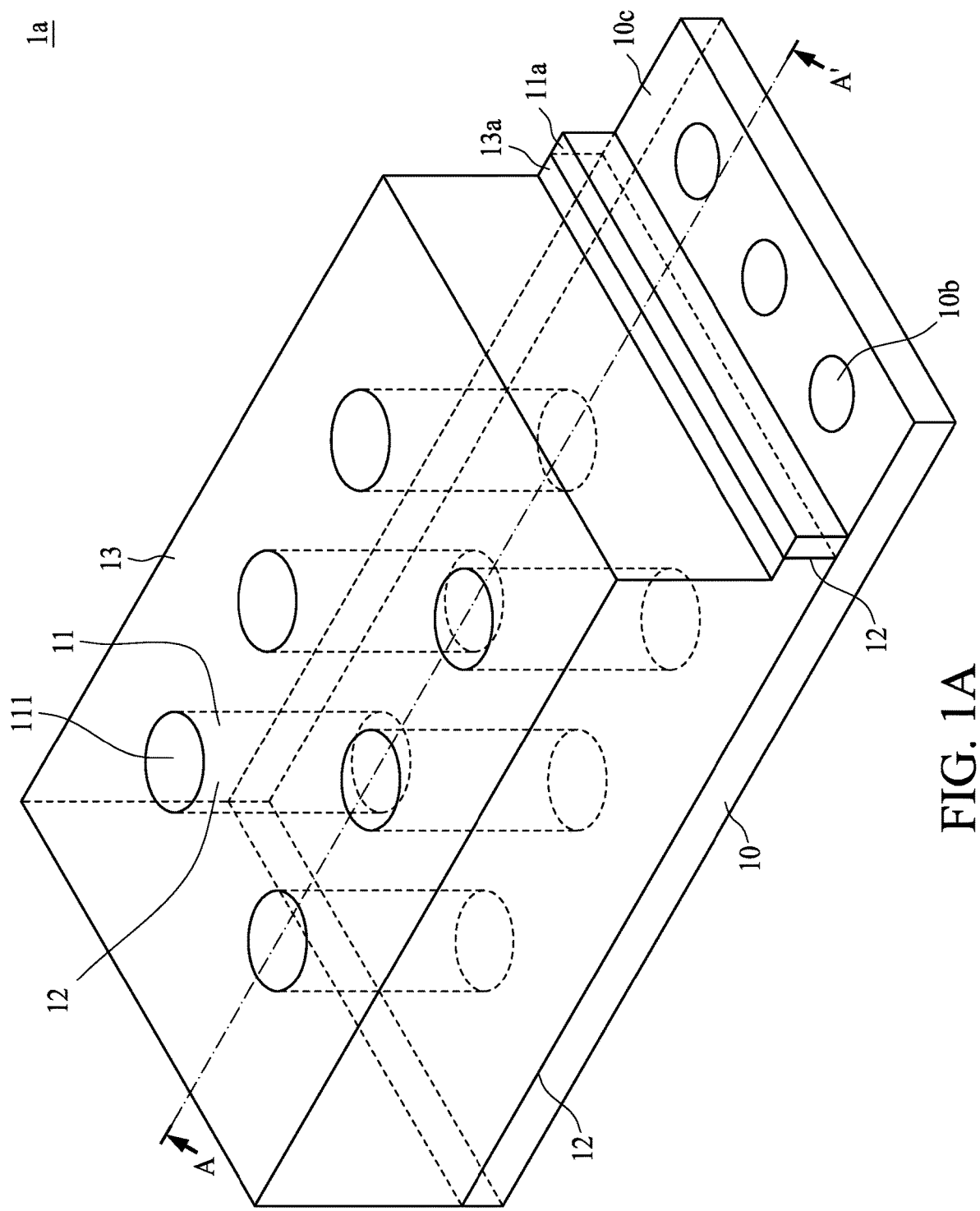
FIG. 1A illustrates a perspective view of a semiconductor device package in accordance with some embodiments of the subject application.

Common reference numerals are used throughout the drawings and the detailed description to indicate the same or similar components. Embodiments of the present disclosure will be readily understood from the following detailed description taken in conjunction with the accompanying drawings.

DETAILED DESCRIPTION

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

A semiconductor device package includes a semiconductor device and a protection layer on the semiconductor device.

The semiconductor device may include an electronic component (e.g. a finger print sensor). The semiconductor device may include an optical area and an electrical area. The semiconductor device may include pixels in the optical area. The semiconductor device may include conductive pads or bonding pads in the electrical area.

The semiconductor device package may include a collimator on each of the pixels. The protection layer may cover or encapsulate the optical area of the semiconductor device. The protection layer may cover or encapsulate the collimator of the semiconductor device. The protection layer may expose the collimator of the semiconductor device. The protection layer may cover or encapsulate the electrical area of the semiconductor device. The conductive pads or bonding pads in the electrical area of the semiconductor device are exposed by the protection layer.

FIG. 1A illustrates a perspective view of a semiconductor device package in accordance with some embodiments of the subject application. The semiconductor device package 1a includes a semiconductor device 10, optical conductive pillars 11 (or collimators 11), an opaque layer 12, a protection layer 13 and a wall 11a.

The semiconductor device 10 may include an electronic component (e.g. a finger print sensor). The semiconductor device 10 may include an optical area (not denoted in FIG. 1A) and an electrical area (or a bonding area) 10c. The semiconductor device 10 may include pixels (not denoted in FIG. 1A) in the optical area. The semiconductor device 10 may include conductive pads 10b or bonding pads 10b in the electrical area 10c. The pixels may be disposed in a pixel area (such as in a pixel array unit). The pixels having photoelectric conversion elements such as photodiodes are arranged in a matrix (array) form. The pixel is controlled by a control unit, receives light of an object at each pixel, photoelectric-converts the incident light to accumulate electric charges, and outputs the electric charges accumulated in each pixel as a pixel signal at a predetermined timing. In some embodiments, the semiconductor device 10 includes an image sensor, such as a light detector which is, for example, a PIN diode (e.g., a diode including a p-type semiconductor region, an intrinsic semiconductor region, and an n-type semiconductor region), a photo-diode, or a photo-transistor. The semiconductor device 10 has a plurality of pixels 10p (e.g., light sensing pixels or imaging pixels) on the active surface 101. The semiconductor device 10 includes a bonding area 10c. The semiconductor device 10 includes bonding pads 10b to provide electrical connections between the semiconductor device 10 and other device(s) or circuit(s).

An optical conductive pillar 11 is disposed on each of the pixels. A surface 111 of the optical conductive pillar 11 is exposed by the protection layer 13. An optical conductive pillar 11 is in direct contact with each of the pixels.

The protection layer 13 may cover or encapsulate the optical area of the semiconductor device 10. The protection layer 13 may include an encapsulant material. In some embodiments, the protection layer 13 may include, for example, organic materials (e.g., molding compound, bismaleimide triazine (BT), polyimide (PI), polybenzoxazole (PBO), solder resist, Ajinomoto build-up film (ABF), polypropylene (PP), epoxy-based material, or a combination of two or more thereof), inorganic materials (e.g., silicon, glass, ceramic or quartz), photoresist, dry-film materials, or a combination of two or more thereof. In some embodiments, the protection layer 13 may be transparent or opaque depending on design specifications of various embodiments. The protection layer 13 may include filler(s) or particle(s).

The protection layer 13 may cover or encapsulate the optical conductive pillar 11. The protection layer 13 may expose the optical conductive pillar 11. The protection layer 13 may be disposed on the electrical area 10c of the semiconductor device 10. The conductive pads 10b in the area 10c of the semiconductor device 10 are exposed by the protection layer 13. The protection layer 13 may include a relatively high portion 13 and a relatively low portion 13a. The relatively high portion 13 and the relatively low portion 13a may form a step structure. The relatively low portion 13a is disposed adjacent to the wall 11a. The relatively low portion 13a and the wall 11a have a substantially same height.

The optical conductive pillar 11 may include, e.g., photosensitive transparent resin. The wall 11a may include material similar or same to the material of the optical conductive pillar 11. In some other embodiments, the wall 11a may be include material similar or same to the protection layer 13. The wall 11a may include transparent material(s). The wall 11a may include opaque material(s). In some other embodiments, the wall 11a may include material different from the material of the optical conductive pillar 11.

The opaque layer 12 is disposed on a side surface or lateral surface of each of the optical conductive pillars 11. The opaque layer 12 is disposed between the protection layer 13 and the semiconductor device 10. The opaque layer 12 is disposed between the relatively low portion 13a and the wall 11a.

The wall 11a is disposed adjacent to the conductive pads 10b. The conductive pads 10b in the area 10c of the semiconductor device 10 are exposed by the wall 12.

Figure 1B:
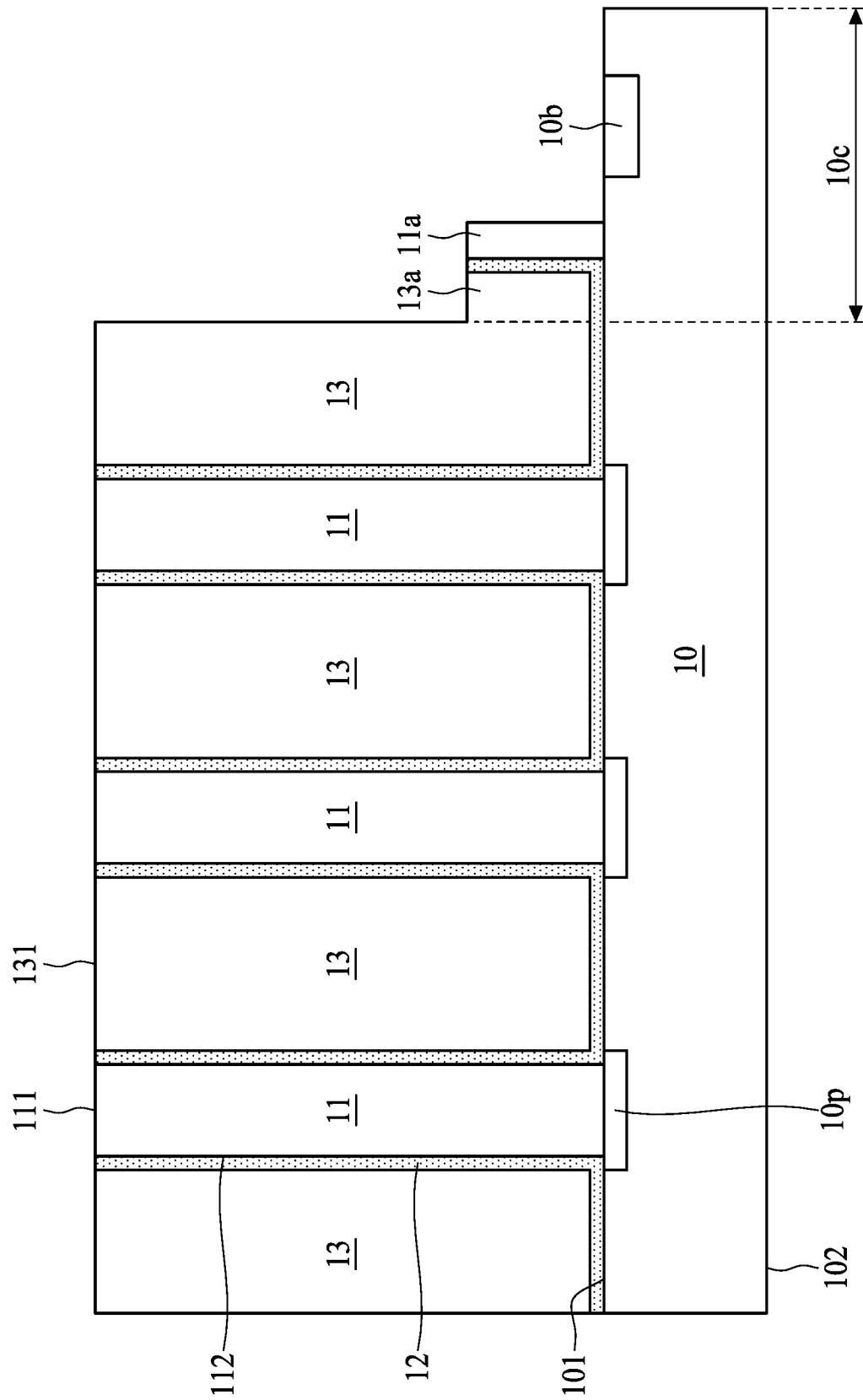
FIG. 1B illustrates a cross-sectional view of the semiconductor device package across a line AA' as shown in FIG. 1A.

FIG. 1B illustrates a cross-sectional view of the semiconductor device package 1a across a line AA' as shown in FIG. 1A.

The semiconductor device 10 has an active surface 101 (also referred to as top surface or light receiving surface) and a back surface 102 (also referred to as bottom surface) opposite to the active surface 101.

The optical conductive pillars 11 are disposed on the active surface 101 of the semiconductor device 10 and substantially perpendicular to the active surface 101 of the semiconductor device 10. As shown in FIG. 1B, each of the optical conductive pillars 11 is disposed on a corresponding pixel 10p on the active surface 101 of the semiconductor device 10. Each of the optical conductive pillars 11 allows the light with a desired wavelength (or a desired range of wavelengths) passing through. In some embodiments, an aspect ratio of the optical conductive pillars 11 may be greater than about 5:1, greater than about 10:1, or greater than about 20:1. In some embodiments, the width of the optical conductive pillars 11 may be, e.g., less than about 10 micrometer (μm), less than about 5 μm, or less than about 2 μm. In some embodiments, the height of the optical conductive pillars 11 may be, e.g., greater than about 100 μm, greater than about 150 μm, or greater than about 200 μm.

An opaque layer 12 is disposed on a sidewall 112 or side surface 112 (also referred to as lateral surface) of each of the optical conductive pillars 11 to cover the sidewall 112 of each of the optical conductive pillars 11. The opaque layer 12 exposes a top surface 111 of each of the optical conductive pillars 11. The opaque layer 12 may be disposed between the protection layer 13 and the active surface 101 of the semiconductor device 10. The opaque layer 12 may expose the bonding area 10c. The opaque layer 12 may expose the pixels 10p of the semiconductor device 10. The opaque layer 12 may be disposed between the portion 13a and the wall 11a. The opaque layer 12 may be disposed on a surface (not denoted in FIG. 1B) of the wall 11a, and the surface of the wall 11a is opposite the portion 13a.

The opaque layer 12 may include a light absorbing layer, ink, photoresist, or a combination of two or more thereof. In some embodiments, the optical conductive pillars 11 covered by the opaque layer 12 may function as a collimator, in which the light (e.g., a direction in which the light is not reflected by the target) reaching the sidewall 112 of the optical conductive pillars 11 is absorbed by the opaque layer 12 so that the interference (also referred to as cross talk) is reduced, and the light propagating substantially in a desired direction (e.g., a direction in which the light reflected by the target is transmitted substantially parallel to lengthwise axes of the conductive pillars 11) is selectively allowed to pass through the optical conductive pillars 11. Such an arrangement improves the optical performance (e.g., image recognition) of the semiconductor device 10.

The protection layer 13 is disposed on the active surface 101 of the semiconductor device 10. The protection layer 13 is disposed on the opaque layer 12. The protection layer 13 covers the opaque layer 12. The protection layer 13 covers a portion of the active surface 101 of the semiconductor device 10. The protection layer 13 exposes the top surface 111 of the optical conductive pillar 11. The protection layer 13 exposes the bonding area 10c of the semiconductor device 10. For example, a top surface 131 of the protection layer 13 is substantially coplanar with the top surface 111 of the optical conductive pillar 11. The protection layer 13 includes a relatively high portion 13 and a relatively low portion 13a. The portion 13 and the portion 13a form a step structure. The portion 13 and the portion 13a may be formed in one piece. The portion 13a is disposed adjacent to the wall 11a.

The wall 11a is in direct contact with the semiconductor device 10. A top surface of the portion 13a is substantially coplanar with a top surface of the wall 11a.

In some embodiments, a semiconductor device as disclosed may include a light transmission layer and a light shielding layer below the light conductive pillars. The light transmission layer may help relaxing a specification of the aspect ratio of the light conductive pillars.

Figure 1C:
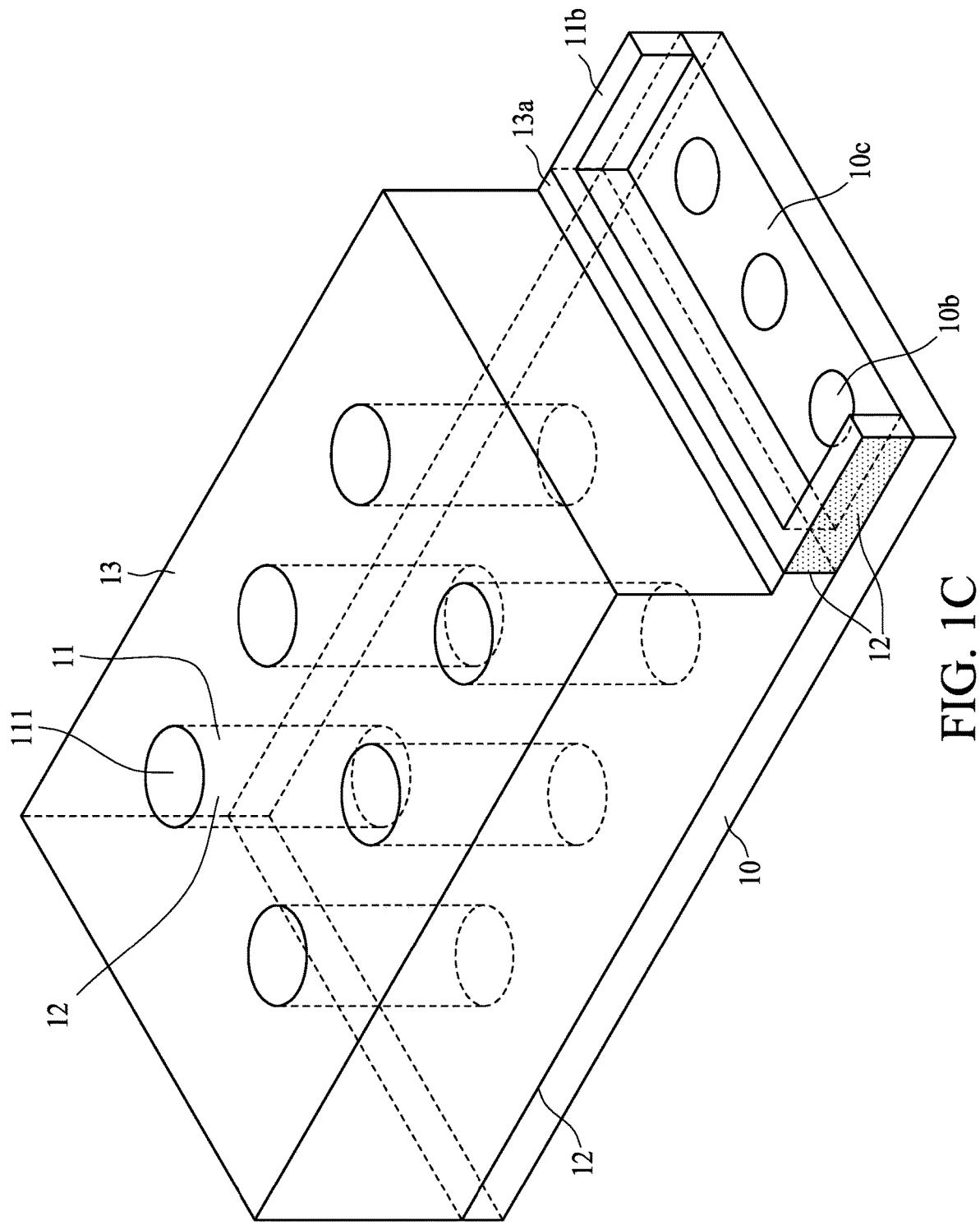
FIG. 1C illustrates a perspective view of a semiconductor device package in accordance with some embodiments of the subject application.

FIG. 1C illustrates a perspective view of a semiconductor device package in accordance with some embodiments of the subject application. The semiconductor device package 1c is similar to the semiconductor device package 1a as described and illustrated with reference to FIG. 1A, except that the wall 11a is replaced by a wall 11b. The opaque layer 12 is disposed between the wall 11b and the portion 13a. The opaque layer 12 is disposed on three outer surfaces (not denoted in FIG. 1C) of the wall 11b. The top surface of the wall 11b is exposed by the opaque layer 12. One of the side surfaces of the wall 11b is exposed by the opaque layer 12. Some of the side surfaces of the wall 11b are exposed by the opaque layer 12.

Figure 2A:
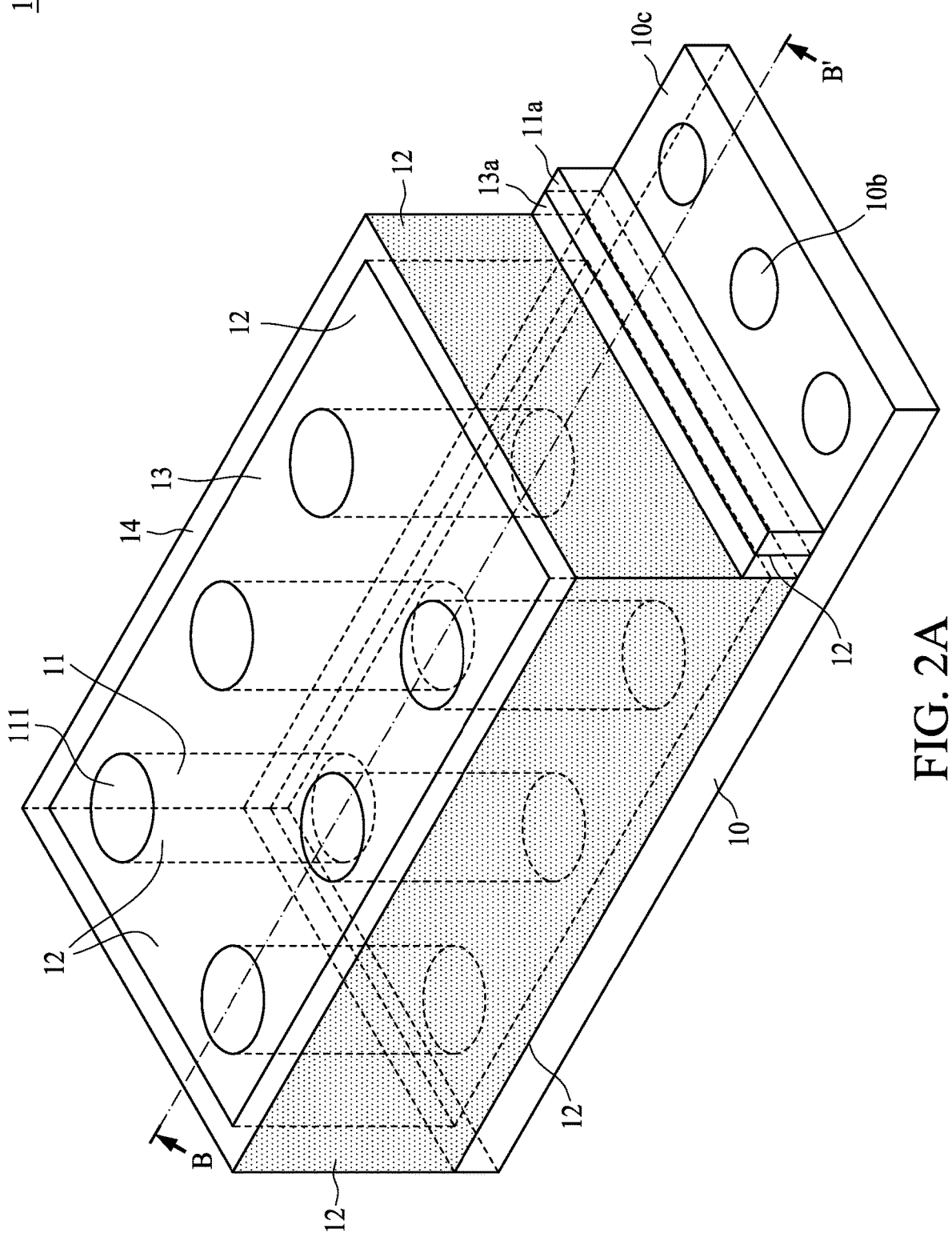
FIG. 2A illustrates a perspective view of a semiconductor device package in accordance with some embodiments of the subject application.

FIG. 2A illustrates a perspective view of a semiconductor device package in accordance with some embodiments of the subject application. The semiconductor device package 1b is similar to the semiconductor device package 1a as described and illustrated with reference to FIG. 1A, except that a periphery of the protection layer 13 as shown in FIG. 1A is replaced by a wall 14. The protection layer 13 is separated from the wall 13a by the wall 14.

The wall 14 may include material similar or same to the material of the optical conductive pillar 11. The wall 14 may include material different from the material of the optical conductive pillar 11. The wall 14 may be adjacent to the wall 13a. The wall 14 surrounds the protection layer 13. The wall 14 surrounds the optical conductive pillars 11. The wall 14 is disposed on the semiconductor device 10. The wall 14 is in direct contact with the semiconductor device 10.

The opaque layer 12 is disposed on the outer side surfaces of the wall 14. The opaque layer 12 is disposed on the inner side surfaces of the wall 14. The wall 14 has a top surface or upper surface which is coplanar with the top surface 131 of the protection layer 13.

Figure 2B:
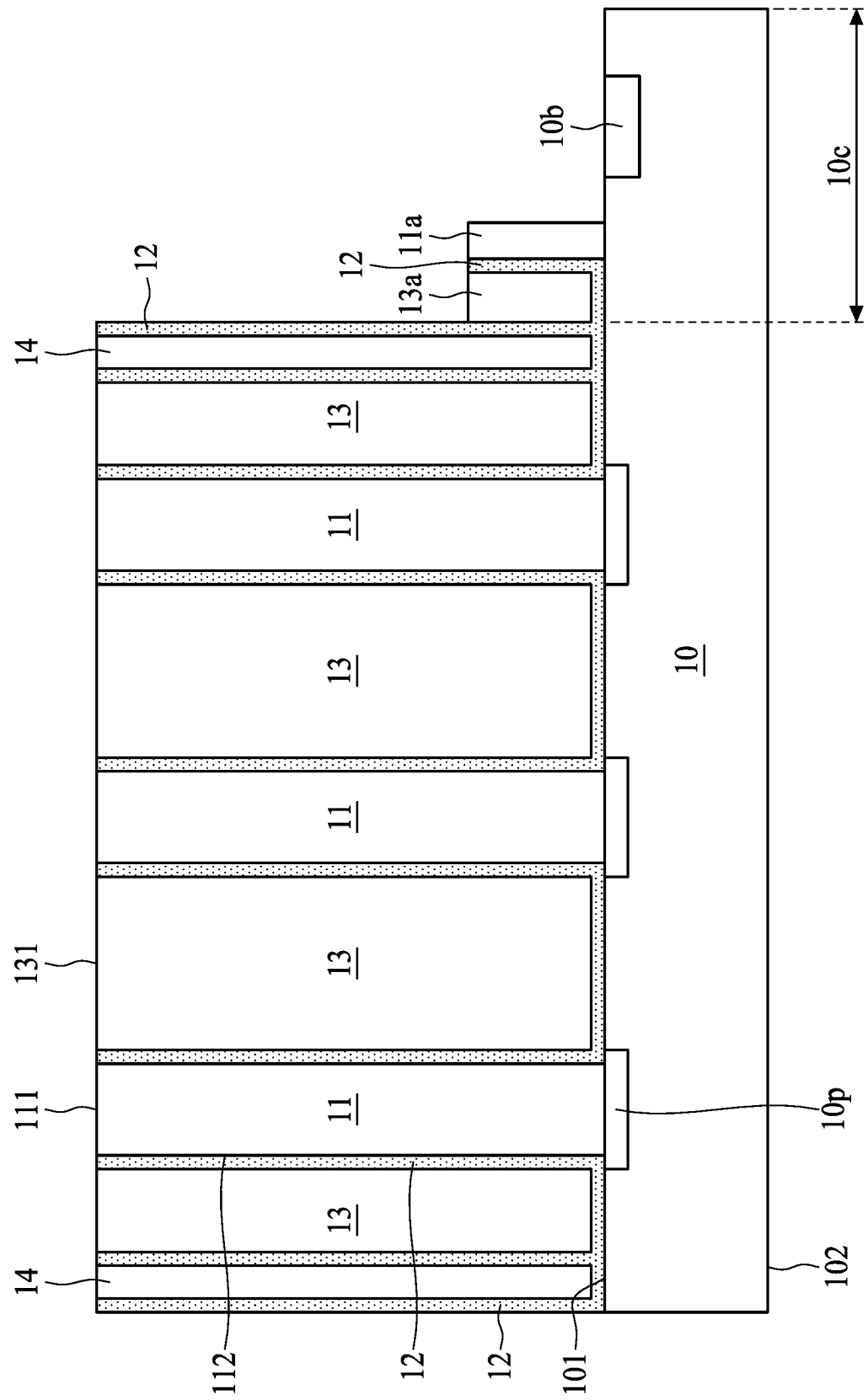
FIG. 2B illustrates a cross-sectional view of the semiconductor device package across a line BB' as shown in FIG. 2A.

FIG. 2B illustrates a cross-sectional view of the semiconductor device package 1b across a line BB' as shown in FIG. 2A.

Figure 2C:
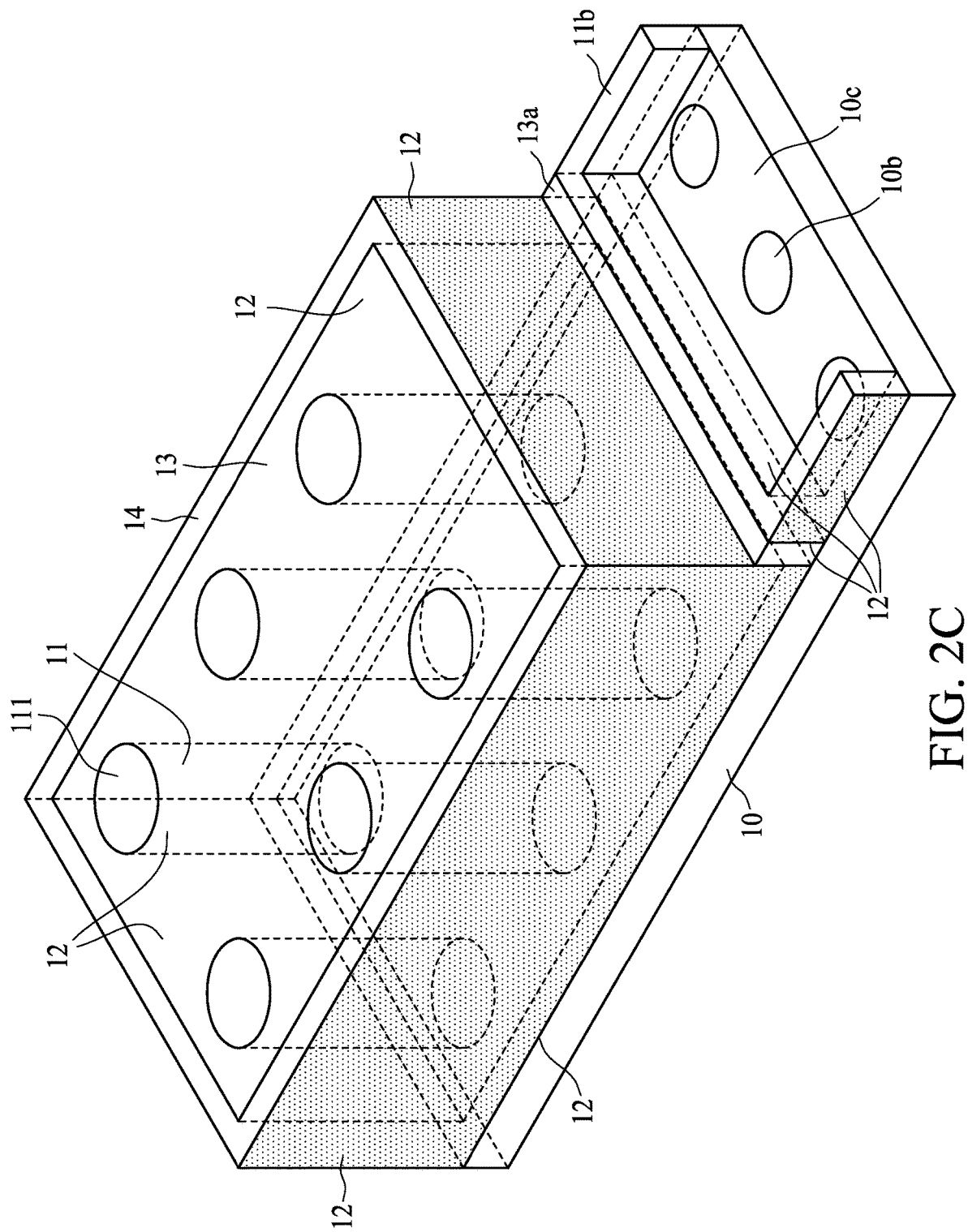
FIG. 2C illustrates a perspective view of a semiconductor device package in accordance with some embodiments of the subject application.

FIG. 2C illustrates a perspective view of a semiconductor device package in accordance with some embodiments of the subject application. The semiconductor device package 1d is similar to the semiconductor device package 1b as described and illustrated with reference to FIG. 2A, except that the wall 11a is replaced by a wall 11b.

Figure 3:
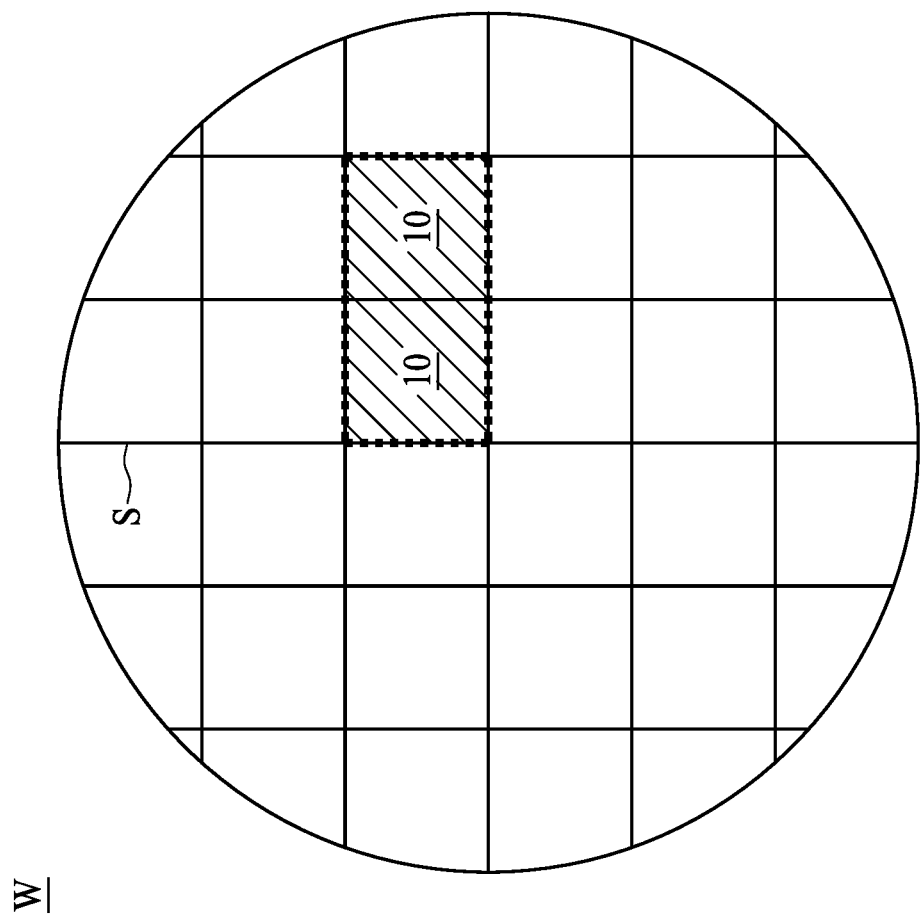
FIG. 3 illustrates a top view of a wafer in accordance with some embodiments of the subject application.

FIG. 3 illustrates a top view of a wafer in accordance with some embodiments of the subject application. The wafer W may include a number of semiconductor devices 10. Each of the semiconductor devices 10 may be singulated or cut to be separated from a neighbor semiconductor device 10 along a scribe line S.

FIG. 3A, FIG. 3B, FIG. 3C, FIG. 3D, FIG. 3E and FIG. 3F illustrate various stages of a method for manufacturing a semiconductor device package 1b as shown in FIG. 2A in accordance with some embodiments of the subject application. Although some processes, operations or steps are described in the following with respect to each of a plurality of components, any of those processes, operations or steps may be selectively performed with respect to one of the plurality of components, or with respect to some number in between one and the full plurality of components.

Figure 3A:
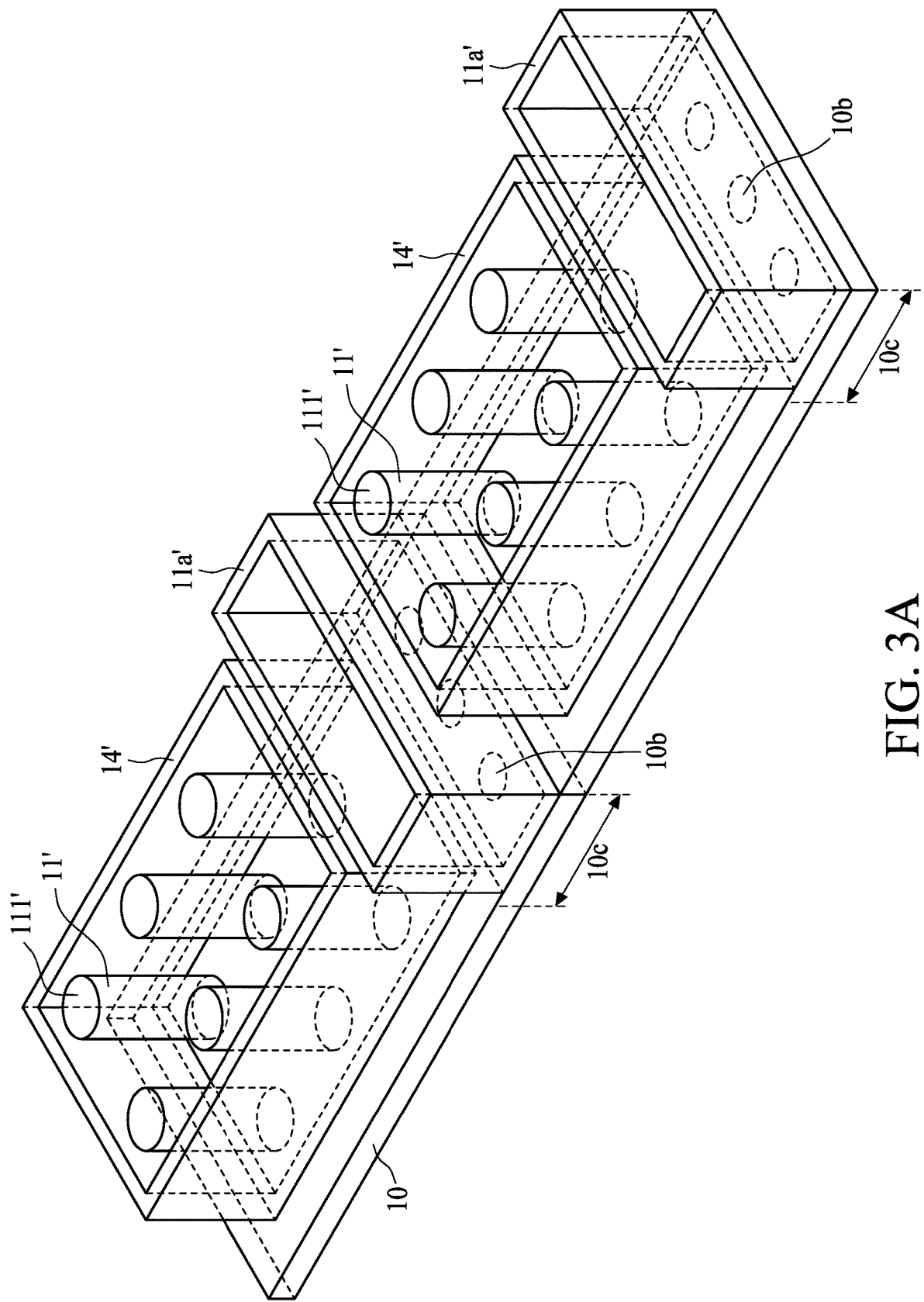
FIG. 3A, FIG. 3B, FIG. 3C, FIG. 3D, FIG. 3E and FIG. 3F illustrate various stages of a method for manufacturing a semiconductor device package as shown in FIG. 2A in accordance with some embodiments of the subject application.

FIG. 3A illustrates one or more stages of a method for manufacturing a semiconductor device package in accordance with some embodiments of the subject application. For simplicity, two of the semiconductor devices 10 in the dotted box of the wafer W as shown in FIG. 3 are illustrated in FIG. 3A, and other semiconductor devices 10 are omitted.

A wall 14' is formed on the semiconductor device 10. A number of optical conductive pillars 11' are formed on the semiconductor device 10. The wall 14' surrounds the optical conductive pillars 11'. A wall 11a' is formed on the semiconductor device 10. The wall 11a' surrounds the conductive pads 10b of the semiconductor device 10. The wall 11a' is separated from the wall 14' by a space or a distance. Each of the optical conductive pillars 11' has a top surface 111'. The wall 14' may be formed by a photolithographic technique. The wall 11a' may be formed by a photolithographic technique. The optical conductive pillars 11' may be formed by a photolithographic technique. The wall 11a' and the optical conductive pillars 11' may be formed in same operation(s). The wall 11a', the wall 14' and the optical conductive pillars 11' may be formed in same operation(s). The wall 14' may protect the optical conductive pillars 11' from the impact of the liquid/water flow during the manufacturing (e.g. development operation). Optical conductive pillars 11 are formed on an active surface 101 of the semiconductor device 10 and substantially perpendicular to the active surface 101 of the semiconductor device 10. Each of the optical conductive pillars 11 is formed on a corresponding pixel on the active surface 101 of the semiconductor device 10. Size or dimension of the optical conductive pillars 11 may be changed or varied in other embodiments of the subject application. Size or dimension of the wall 11a' may be changed or varied in other embodiments of the subject application. Size or dimension of the wall 14' may be changed or varied in other embodiments of the subject application.

Figure 3B:
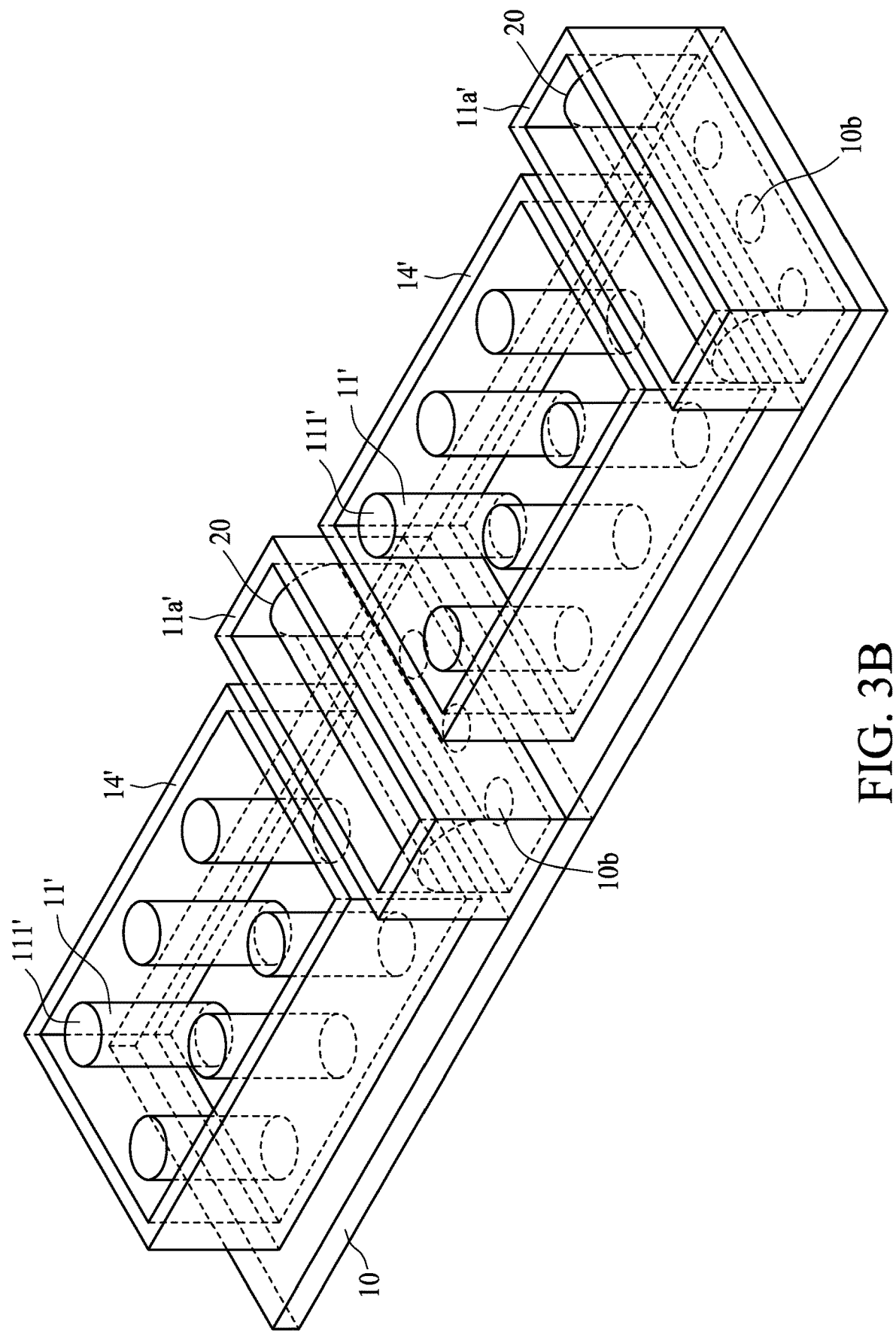

FIG. 3B illustrates one or more stages of a method for manufacturing a semiconductor device package in accordance with some embodiments of the subject application. A sacrificial structure 20 is formed in the wall 11a'. A sacrificial structure 20 is formed in a space defined by the wall 11a'. A sacrificial structure 20 is surrounded or enclosed by the wall 11a'. The sacrificial structure 20 occupies a portion of the space defined by the wall 11a'. The sacrificial structure 20 covers the semiconductor device 10. The sacrificial structure 20 covers the conductive pads 10 of the semiconductor device 10. The sacrificial structure 20 is in direct contact with the active surface 101 of the semiconductor device 10. The sacrificial structure 20 is in direct contact with inner surfaces of the wall 11a'. A top surface of the sacrificial structure 20 is lower than a top surface of the wall 11a'. A sacrificial structure 20 is formed in the wall 11a' to protect the conductive pads 10 of the semiconductor device 10. The sacrificial structure 20 may include material (e.g. TOK bond-debond gel) which can be removed by certain solvents or solutions. The sacrificial structure 20 may be formed by dispensing technique, injection technique or other suitable technique(s).

Figure 3C:
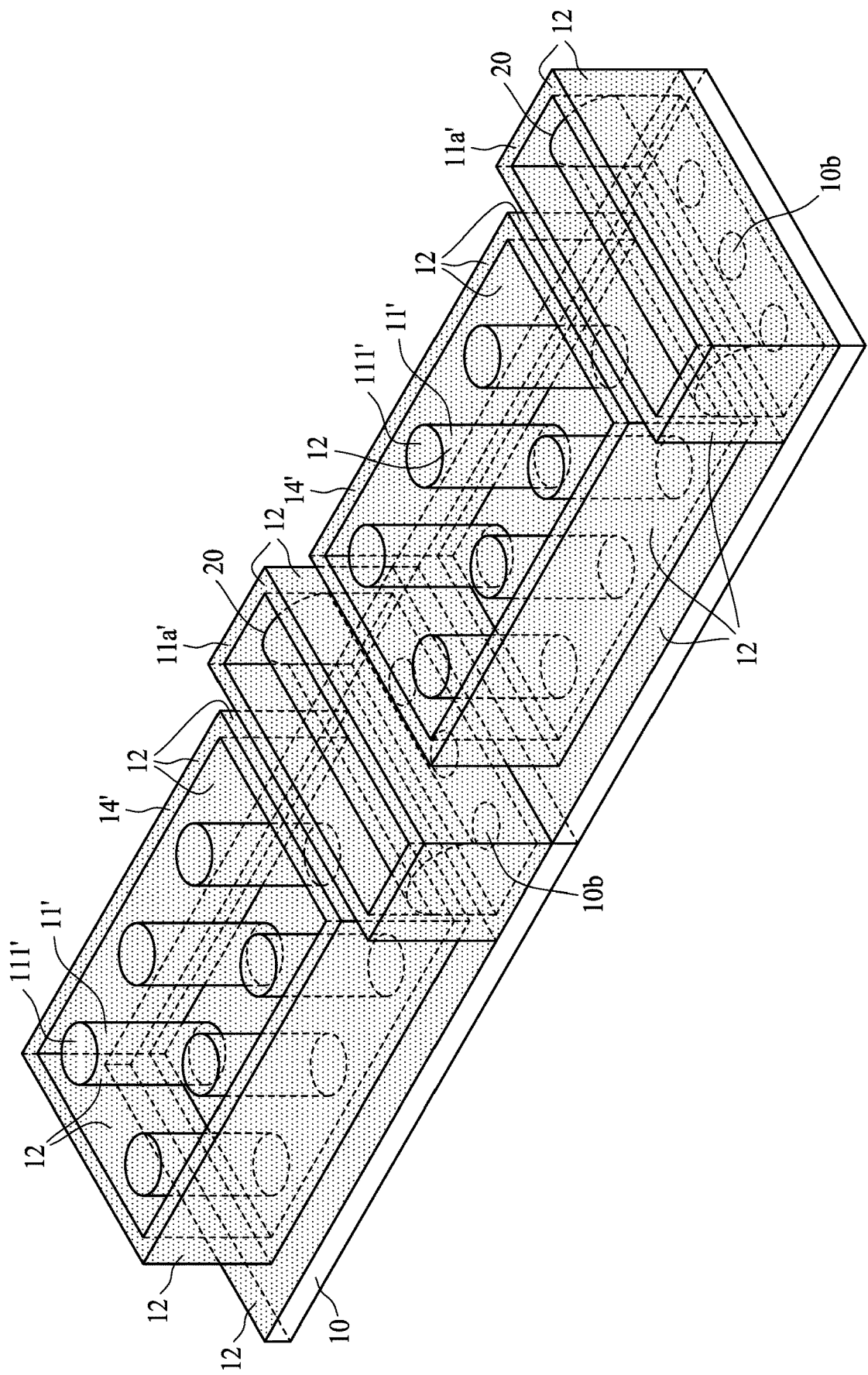

FIG. 3C illustrates one or more stages of a method for manufacturing a semiconductor device package in accordance with some embodiments of the subject application. An opaque layer 12 is formed by, for example but is not limited to a spray technique, a coating technique, a sputtering technique, chemical vapor deposition (CVD) or other suitable technique(s). The opaque layer 12 is formed on each surface of the structure as shown in FIG. 3B, except the upper surface 101 of the semiconductor device 10, the bottom surface 102 of the semiconductor device 10 and the lateral surface of the semiconductor device 10. The sacrificial structure 20 may prevent the opaque layer 12 from contacting the semiconductor device 10. The sacrificial structure 20 may prevent the opaque layer 12 from contacting the conductive pads 10 of the semiconductor device 10. The sacrificial structure 20 may avoid formation of the opaque layer 12 on the conductive pads 10 of the semiconductor device 10.

Figure 3D:
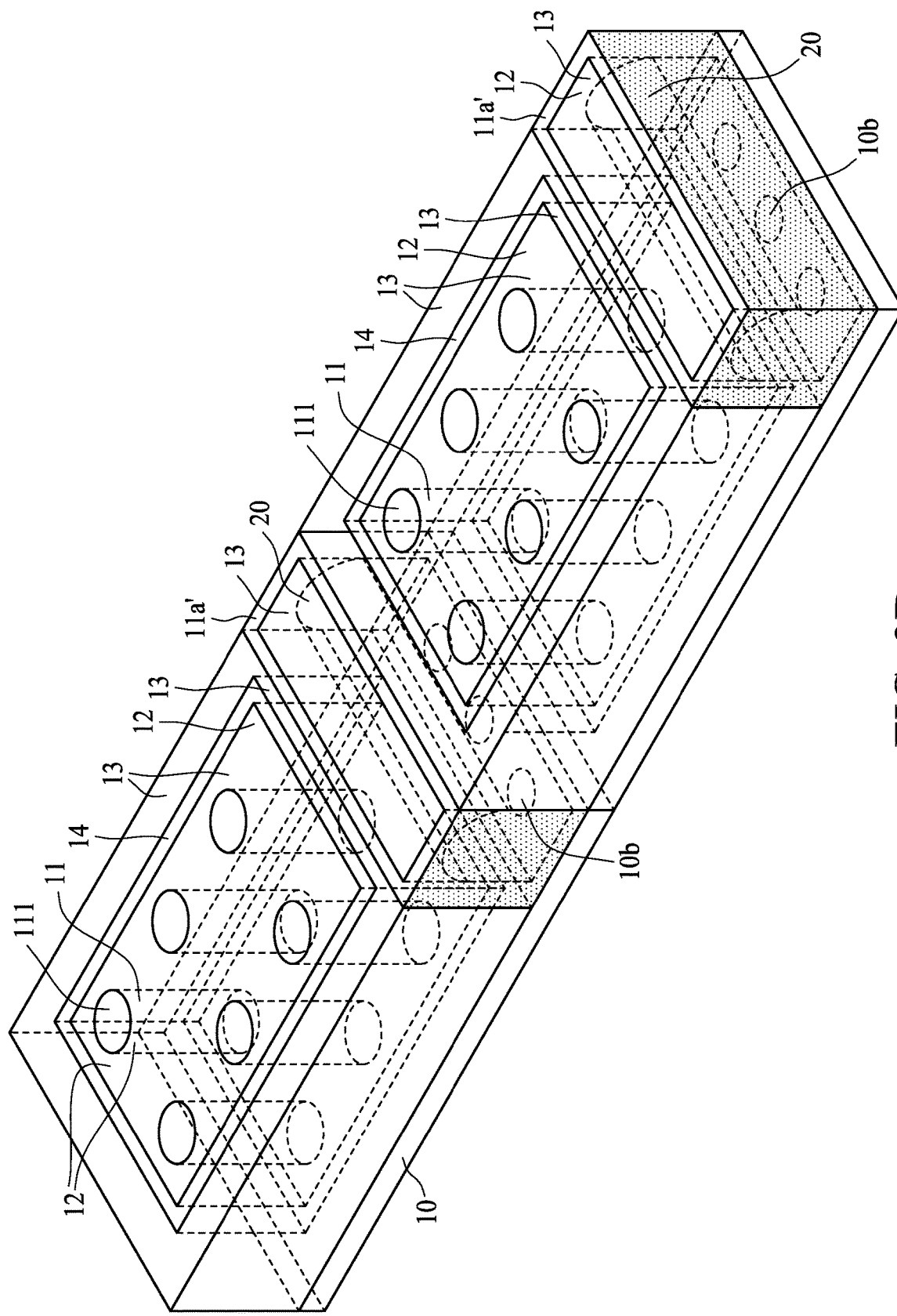

FIG. 3D illustrates one or more stages of a method for manufacturing a semiconductor device package in accordance with some embodiments of the subject application. A protection layer 13 is formed to cover the optical conductive pillars 11' as shown in FIG. 3C. A protection layer 13 is formed between the wall 14' and the wall 11a' as shown in FIG. 3C. A protection layer 13 is formed to cover the wall 14' as shown in FIG. 3C. A protection layer 13 is formed to cover the wall 11a' as shown in FIG. 3C. A protection layer 13 is formed to cover the active surface 101 of the semiconductor device 10 as shown in FIG. 3C. A protection layer 13 is formed to cover the opaque layer 12 as shown in FIG. 3C. The protection layer 13 may be formed by, e.g., a molding technique, such as transfer molding or compression molding.

A grinding operation is performed to remove a portion of the protection layer 13 to expose a top surface 111 of each of the optical conductive pillars 11. A grinding operation is performed to remove a portion of the protection layer 13 and the opaque layer 12 on the surface 111' of each of the optical conductive pillars 11' to expose a top surface 111 of each of the optical conductive pillars 11. A grinding operation is performed to remove a portion of the protection layer 13, the opaque layer 12 on the surface 111' of each of the optical conductive pillars 11', and a portion of the each of the optical conductive pillars 11' to expose a top surface 111 of each of the optical conductive pillars 11. A grinding operation is performed to remove a portion of the protection layer 13 to expose a top surface of the wall 14. A grinding operation is performed to remove a portion of the protection layer 13 and the opaque layer 12 to expose a top surface of the wall 14. A grinding operation is performed to remove a portion of the protection layer 13, the opaque layer 12 and a portion of the wall 14' to expose a top surface of the wall 14. A grinding operation is performed to remove the opaque layer 12 on the top surface of the wall 14' to expose a top surface of the wall 14. A grinding operation is performed to remove the opaque layer 12 on the top surface of the wall 14' and a portion of the wall 14' to expose a top surface of the wall 14.

A grinding operation is performed to remove a portion of the protection layer 13 to expose a top surface of the wall 11a'. A grinding operation is performed to remove a portion of the protection layer 13 and the opaque layer 12 to expose a top surface of the wall 11a'. A grinding operation is performed to remove a portion of the protection layer 13, the opaque layer 12 and a portion of the wall 11a' to expose a top surface of the wall 11a'. A grinding operation is performed to remove the opaque layer 12 on the top surface of the wall 11a' to expose a top surface of the wall 11a'. A grinding operation is performed to remove the opaque layer 12 on the top surface of the wall 11a' and a portion of the wall 11a' to expose a top surface of the wall 11a'.

Figure 3E:
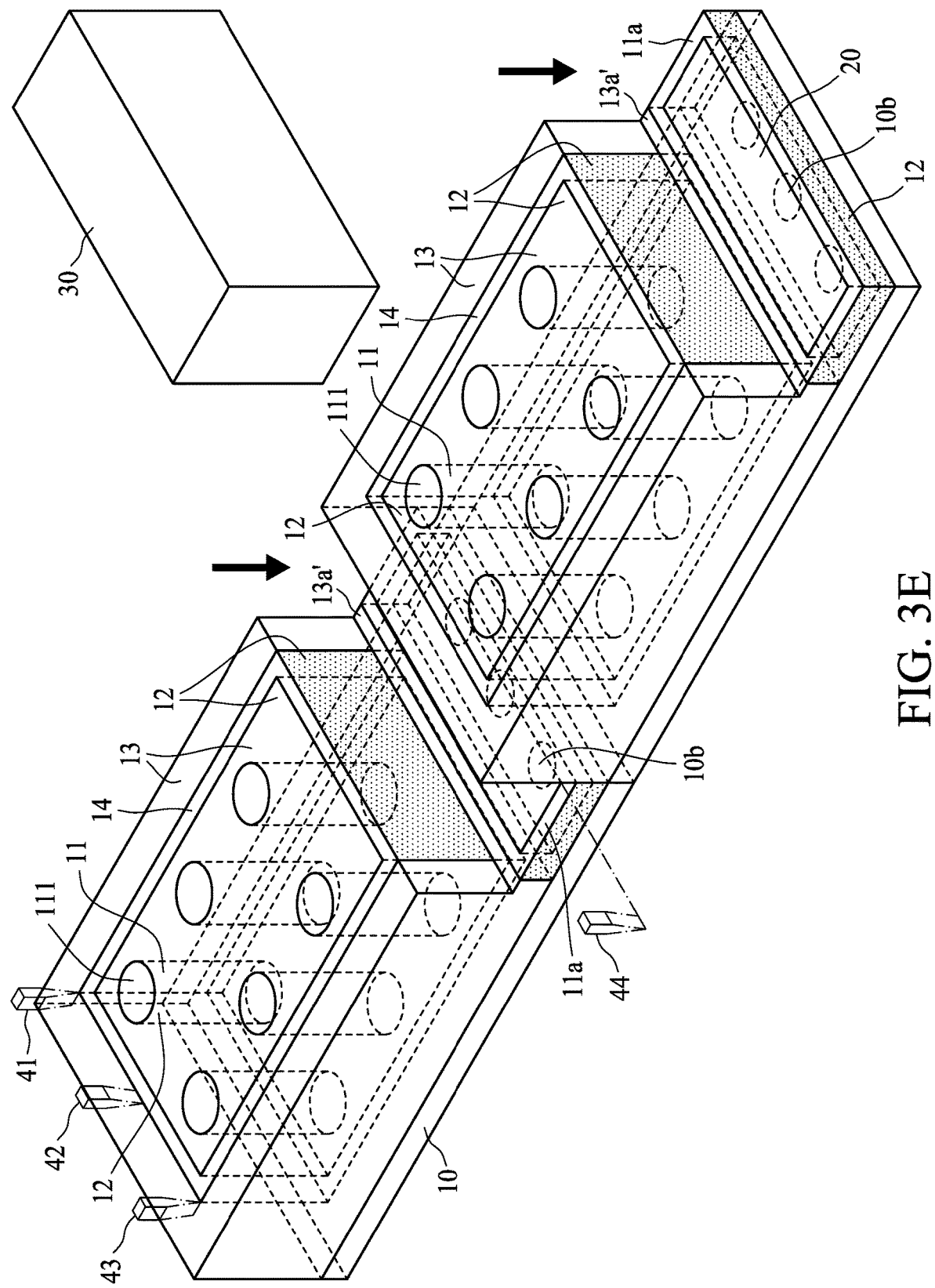

FIG. 3E illustrates one or more stages of a method for manufacturing a semiconductor device package in accordance with some embodiments of the subject application. A cutting operation (e.g. a half-cut operation) is performed to remove the protection layer 13 in the wall 11a' as shown in FIG. 3D. A cutting operation (e.g. a half-cut operation) is performed to remove the whole protection layer 13 in the wall 11a' as shown in FIG. 3D. A cutting operation (e.g. a half-cut operation) is performed to remove a portion of the wall 11a' as shown in FIG. 3D to form a wall 11a. A cutting operation (e.g. a half-cut operation) is performed to remove the opaque layer 12 in the wall 11a' as shown in FIG. 3D. A cutting operation (e.g. a half-cut operation) is performed to remove the whole opaque layer 12 in the wall 11a' as shown in FIG. 3D. A cutting operation (e.g. a half-cut operation) is performed to remove a portion of the sacrificial structure 20 as shown in FIG. 3D. A cutting operation (e.g. a half-cut operation) is performed to remove the protection layer 13 between the wall 14 the wall 11a' as shown in FIG. 3D to form a step structure 13a'. A cutting operation (e.g. a half-cut operation) is performed by a cutting tool 30, e.g. a blade, a knife or other suitable tools.

A top surface of the sacrificial structure 20 is substantially coplanar with a top surface of the wall 11a. A top surface of the step structure 13a' is substantially coplanar with a top surface of the wall 11a.

Figure 3F:
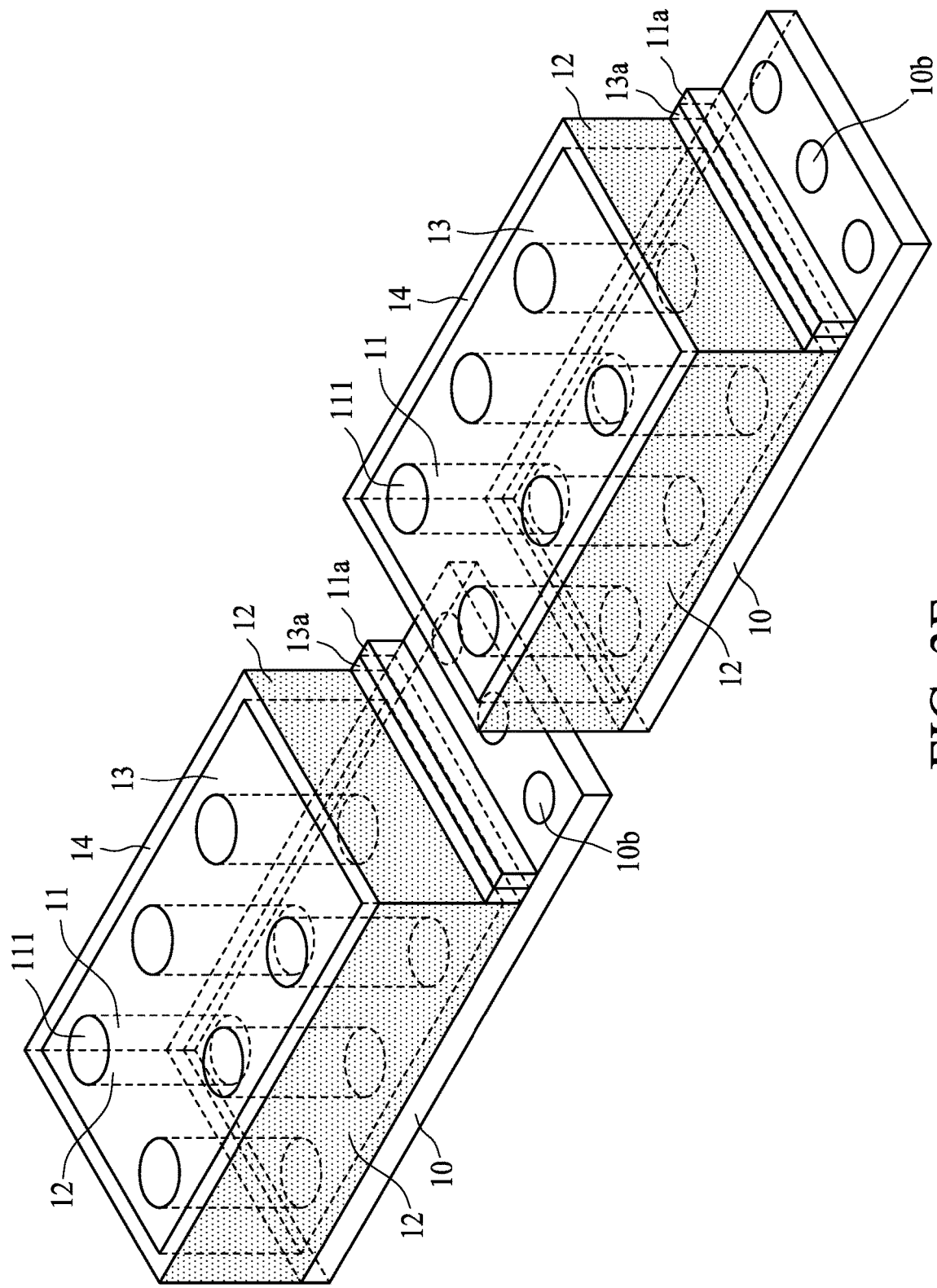

FIG. 3F illustrates one or more stages of a method for manufacturing a semiconductor device package in accordance with some embodiments of the subject application. The sacrificial structure 20 in the wall 11a as shown in FIG. 3E is removed by a solvent or solution. The whole sacrificial structure 20 in the wall 11a as shown in FIG. 3E is removed by a solvent or solution. The sacrificial structure 20 in the wall 11a as shown in FIG. 3E is removed to expose the conductive/bonding pads 10b of the semiconductor device 10.

A singulation operation is performed along the scribe lines S as shown in FIG. 3. A singulation operation is performed by cutting technique. A singulation operation is performed by a tool 41 as shown in FIG. 3E along a scribe lines S to separate a semiconductor device 10 from other semiconductor devices 10. A singulation operation is performed by a tool 42 as shown in FIG. 3E along another scribe lines S to separate a semiconductor device 10 from other semiconductor devices 10. A singulation operation is performed by a tool 43 as shown in FIG. 3E along another scribe lines S to separate a semiconductor device 10 from other semiconductor devices 10. A singulation operation is performed by a tool 44 as shown in FIG. 3E along another scribe lines S to separate a semiconductor device 10 from other semiconductor devices 10. A singulation operation is performed to form a number of semiconductor device packages 1b as shown in FIG. 2A. Each of the tools 41, 42, 43 and 44 as shown in FIG. 3E may include but is not limited to a blade, a knife or other suitable tools. It is contemplated that a width of the each of the tools 41, 42, 43 and 44 as shown in FIG. 3E may be changed in other embodiments of the subject application.

FIG. 4A, FIG. 4B, FIG. 4C, FIG. 4D, FIG. 4E and FIG. 4F illustrate various stages of a method for manufacturing a semiconductor device package 1a as shown in FIG. 1A in accordance with some embodiments of the subject application. Although some processes, operations or steps are described in the following with respect to each of a plurality of components, any of those processes, operations or steps may be selectively performed with respect to one of the plurality of components, or with respect to some number in between one and the full plurality of components.

Figure 4A:
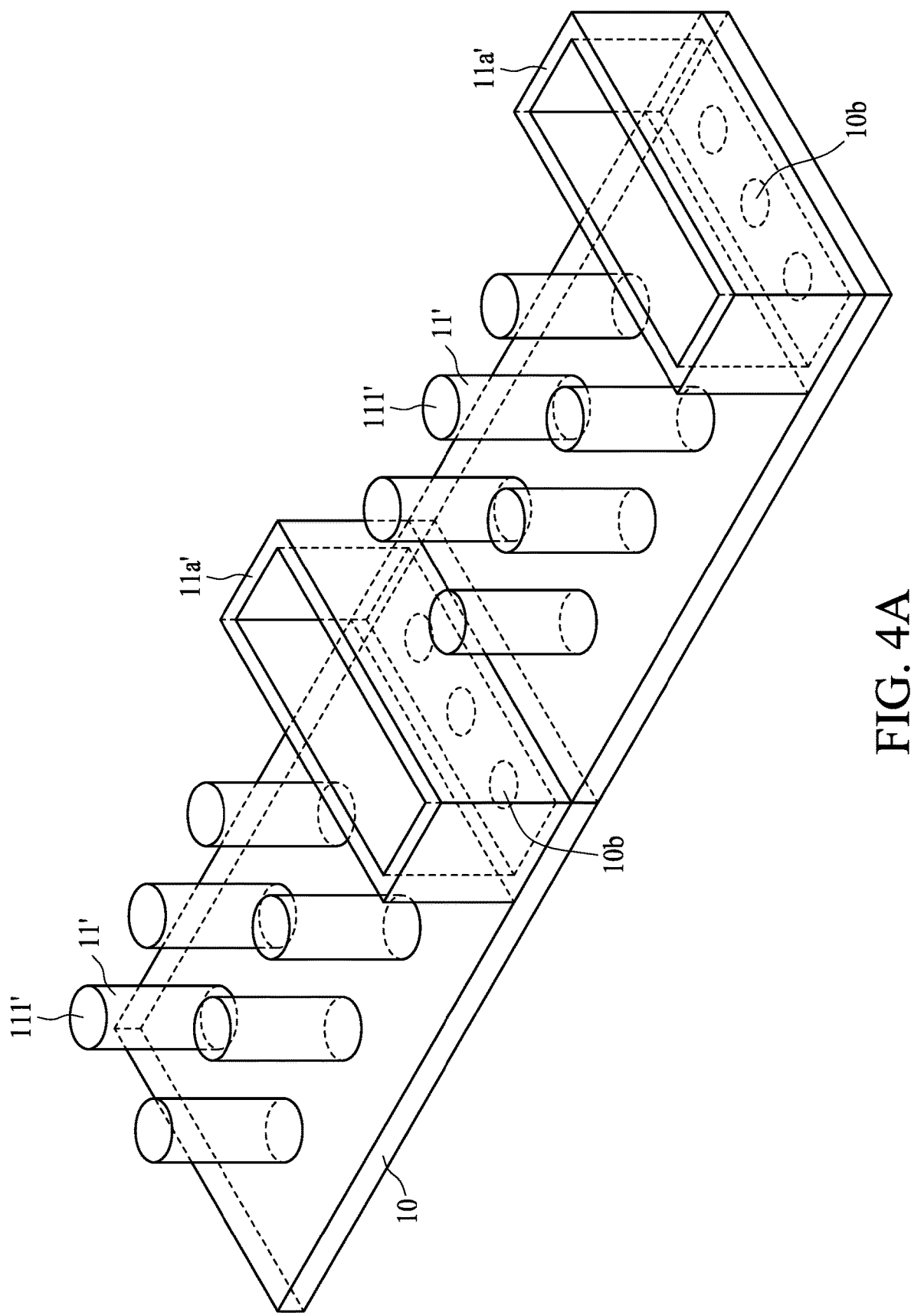
FIG. 4A, FIG. 4B, FIG. 4C, FIG. 4D, FIG. 4E and FIG. 4F illustrate various stages of a method for manufacturing a semiconductor device package as shown in FIG. 1A in accordance with some embodiments of the subject application.

FIG. 4A illustrates one or more stages of a method for manufacturing a semiconductor device package in accordance with some embodiments of the subject application. For simplicity, two of the semiconductor devices 10 in the dotted box of the wafer W as shown in FIG. 3 are illustrated in FIG. 4A, and other semiconductor devices 10 are omitted.

A number of optical conductive pillars 11' are formed on the semiconductor device 10. A wall 11a' is formed on the semiconductor device 10. The wall 11a' surrounds the conductive pads 10b of the semiconductor device 10. Each of the optical conductive pillars 11' has a top surface 111'. The wall 11a' may be formed by a photolithographic technique. The optical conductive pillars 11' may be formed by a photolithographic technique. The wall 11a' and the optical conductive pillars 11' may be formed in same operation(s). Optical conductive pillars 11 are formed on an active surface 101 of the semiconductor device 10 and substantially perpendicular to the active surface 101 of the semiconductor device 10. Each of the optical conductive pillars 11 is formed on a corresponding pixel on the active surface 101 of the semiconductor device 10. Size or dimension of the optical conductive pillars 11 may be changed or varied in other embodiments of the subject application. Size or dimension of the wall 11a' may be changed or varied in other embodiments of the subject application.

Figure 4B:
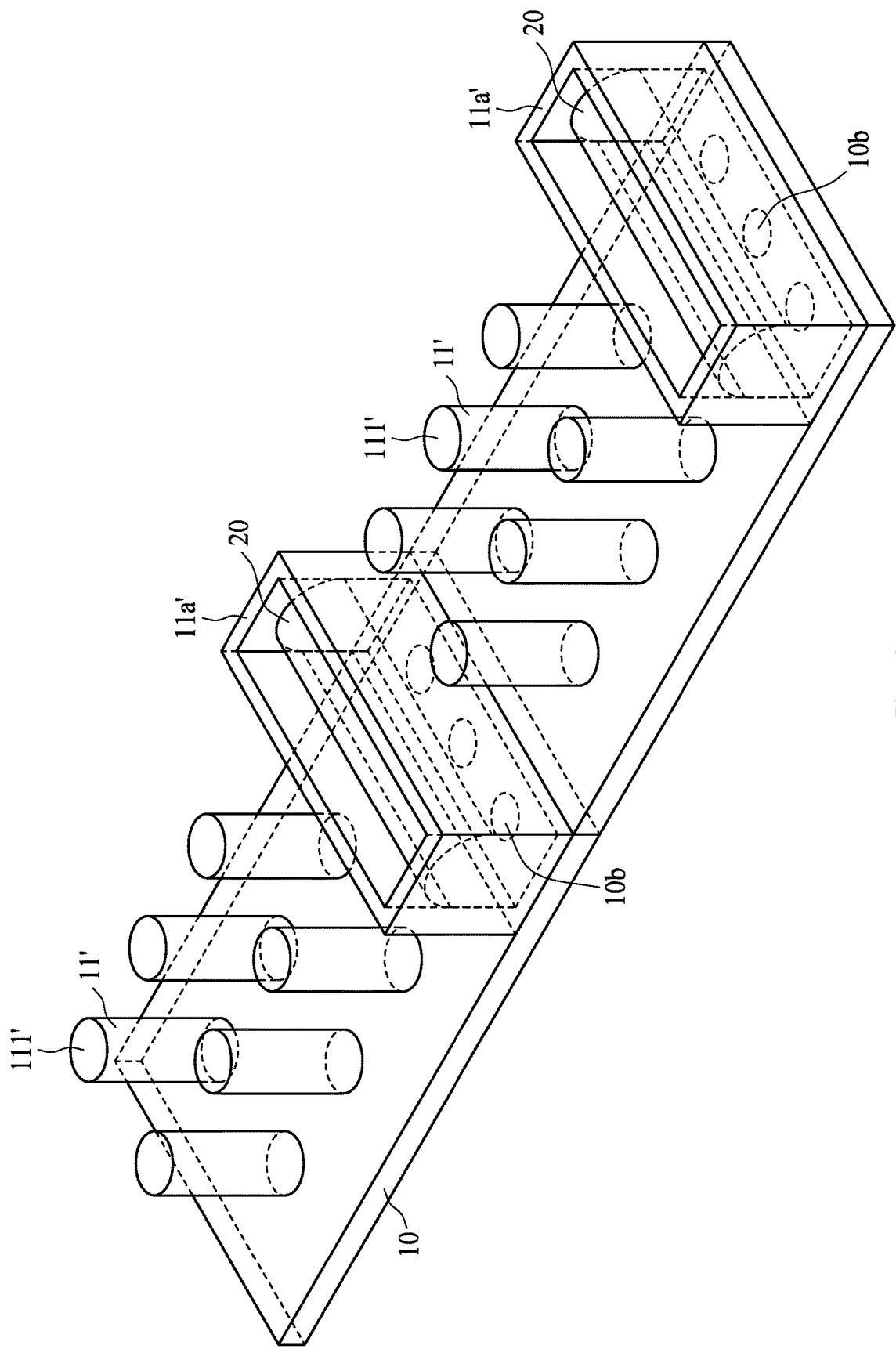

FIG. 4B illustrates one or more stages of a method for manufacturing a semiconductor device package in accordance with some embodiments of the subject application. A sacrificial structure 20 is formed in the wall 11a'. A sacrificial structure 20 is formed in a space defined by the wall 11a'. A sacrificial structure 20 is surrounded or enclosed by the wall 11a'. The sacrificial structure 20 occupies a portion of the space defined by the wall 11a'. The sacrificial structure 20 covers the semiconductor device 10. The sacrificial structure 20 covers the conductive pads 10 of the semiconductor device 10. The sacrificial structure 20 is in direct contact with the active surface 101 of the semiconductor device 10. The sacrificial structure 20 is in direct contact with inner surfaces of the wall 11a'. A top surface of the sacrificial structure 20 is lower than a top surface of the wall 11a'. A sacrificial structure 20 is formed in the wall 11a' to protect the conductive pads 10 of the semiconductor device 10. The sacrificial structure 20 may include material (e.g. TOK bond-debond gel) which can be removed by certain solvents or solutions. The sacrificial structure 20 may be formed by dispensing technique, injection technique or other suitable technique(s).

Figure 4C:
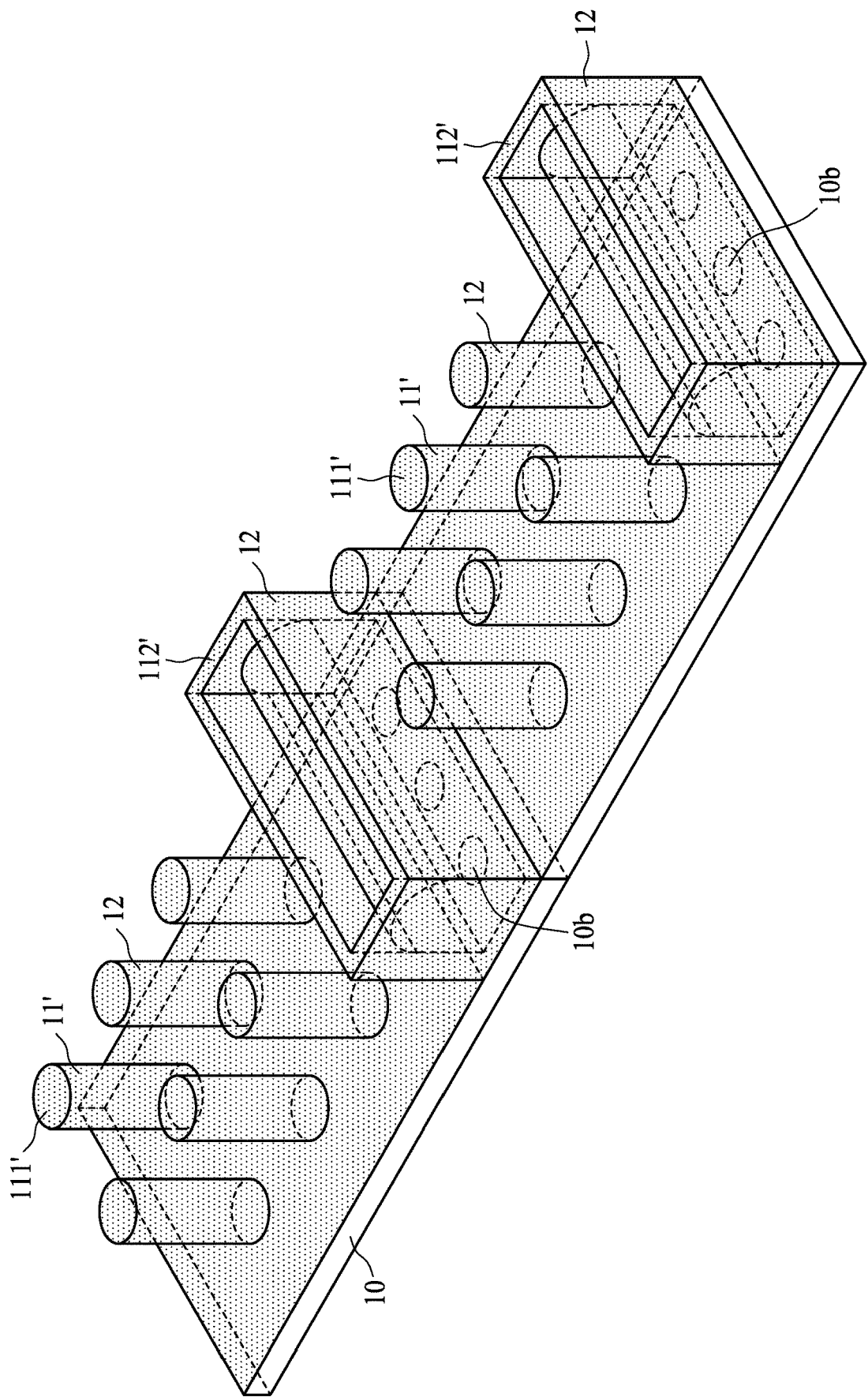

FIG. 4C illustrates one or more stages of a method for manufacturing a semiconductor device package in accordance with some embodiments of the subject application. An opaque layer 12 is formed by, for example but is not limited to a spray technique, a coating technique, a sputtering technique, chemical vapor deposition (CVD) or other suitable technique(s). The opaque layer 12 is formed on each surface of the structure as shown in FIG. 4B, except the upper surface 101 of the semiconductor device 10, the bottom surface 102 of the semiconductor device 10 and the lateral surface of the semiconductor device 10. The sacrificial structure 20 may prevent the opaque layer 12 from contacting the semiconductor device 10. The sacrificial structure 20 may prevent the opaque layer 12 from contacting the conductive pads 10 of the semiconductor device 10. The sacrificial structure 20 may avoid formation of the opaque layer 12 on the conductive pads 10 of the semiconductor device 10.

Figure 4D:
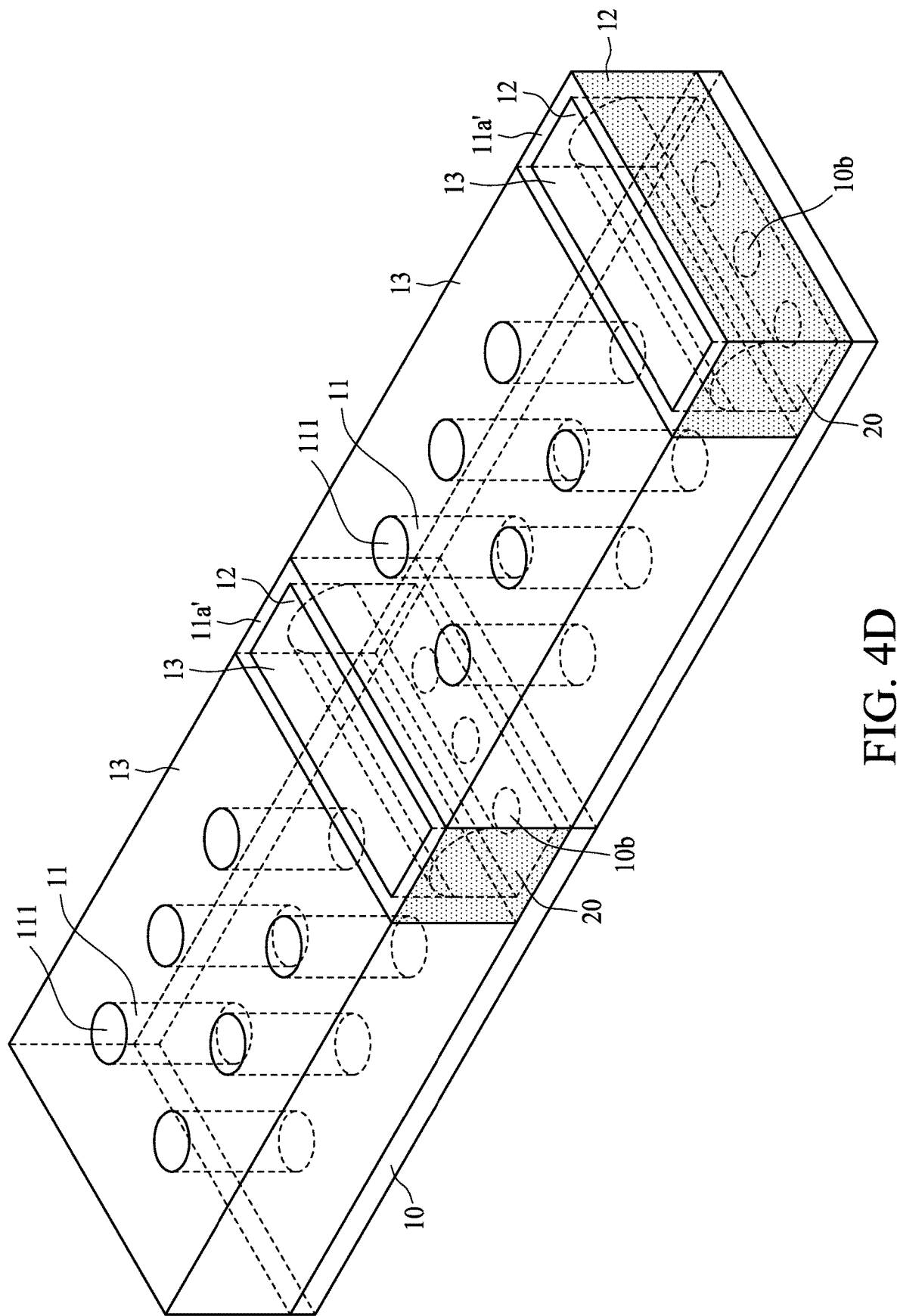

FIG. 4D illustrates one or more stages of a method for manufacturing a semiconductor device package in accordance with some embodiments of the subject application. A protection layer 13 is formed to cover the optical conductive pillars 11' as shown in FIG. 4C. A protection layer 13 is formed to cover the wall 11a' as shown in FIG. 4C. A protection layer 13 is formed to cover the active surface 101 of the semiconductor device 10 as shown in FIG. 4C. A protection layer 13 is formed to cover the opaque layer 12 as shown in FIG. 4C. The protection layer 13 may be formed by, e.g., a molding technique, such as transfer molding or compression molding.

A grinding operation is performed to remove a portion of the protection layer 13 to expose a top surface 111 of each of the optical conductive pillars 11. A grinding operation is performed to remove a portion of the protection layer 13 and the opaque layer 12 on the surface 111' of each of the optical conductive pillars 11' to expose a top surface 111 of each of the optical conductive pillars 11. A grinding operation is performed to remove a portion of the protection layer 13, the opaque layer 12 on the surface 111' of each of the optical conductive pillars 11', and a portion of the each of the optical conductive pillars 11' to expose a top surface 111 of each of the optical conductive pillars 11.

A grinding operation is performed to remove a portion of the protection layer 13 to expose a top surface of the wall 11a'. A grinding operation is performed to remove a portion of the protection layer 13 and the opaque layer 12 to expose a top surface of the wall 11a'. A grinding operation is performed to remove a portion of the protection layer 13, the opaque layer 12 and a portion of the wall 11a' to expose a top surface of the wall 11a'. A grinding operation is performed to remove the opaque layer 12 on the top surface of the wall 11a' to expose a top surface of the wall 11a'. A grinding operation is performed to remove the opaque layer 12 on the top surface of the wall 11a' and a portion of the wall 11a' to expose a top surface of the wall 11a'.

Figure 4E:
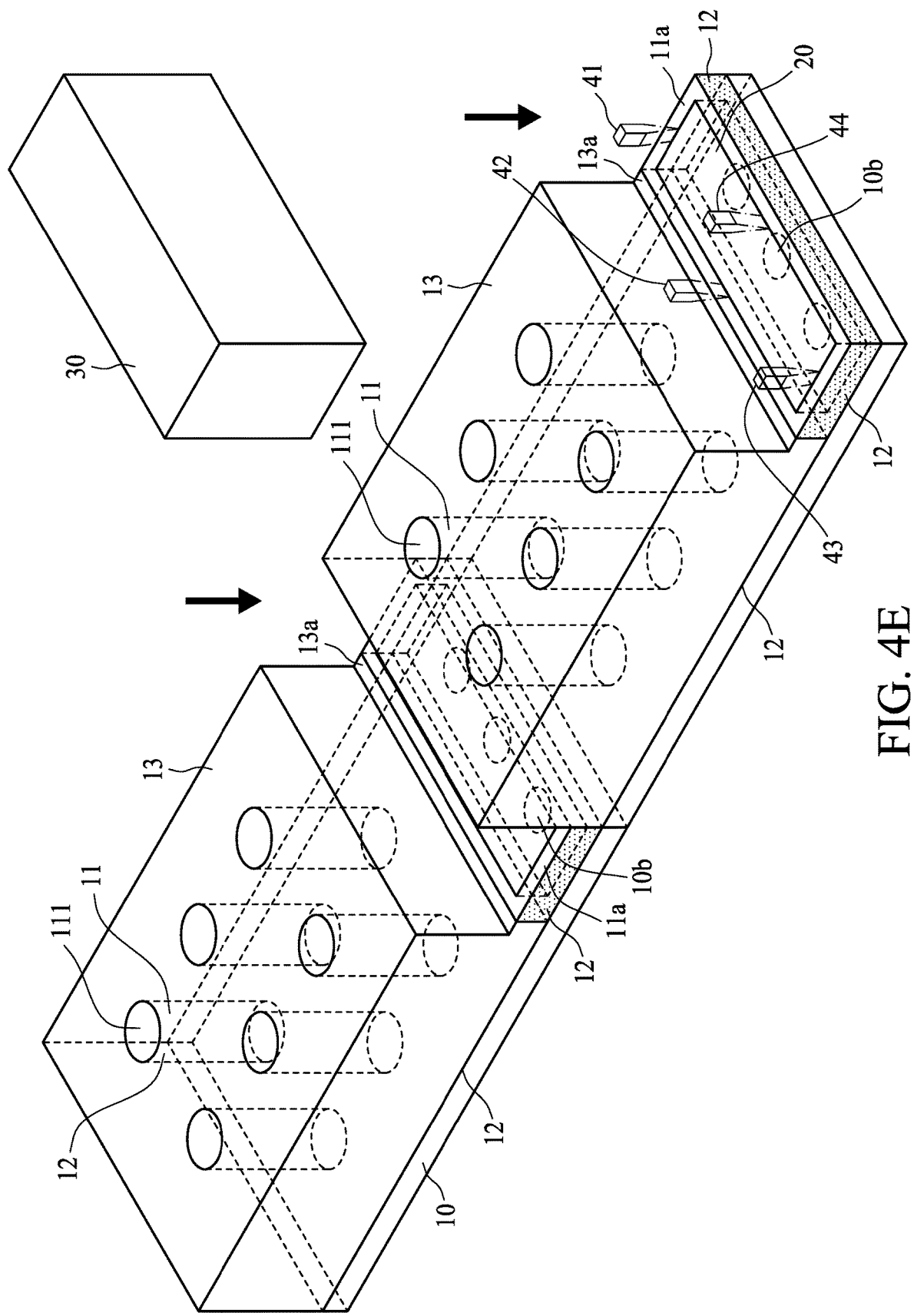

FIG. 4E illustrates one or more stages of a method for manufacturing a semiconductor device package in accordance with some embodiments of the subject application. A cutting operation (e.g. a half-cut operation) is performed to remove the protection layer 13 in the wall 11a' as shown in FIG. 4D. A cutting operation (e.g. a half-cut operation) is performed to remove the whole protection layer 13 in the wall 11a' as shown in FIG. 4D. A cutting operation (e.g. a half-cut operation) is performed to remove a portion of the wall 11a' as shown in FIG. 4D to form a wall 11a. A cutting operation (e.g. a half-cut operation) is performed to remove the opaque layer 12 in the wall 11a' as shown in FIG. 4D. A cutting operation (e.g. a half-cut operation) is performed to remove the whole opaque layer 12 in the wall 11a' as shown in FIG. 4D. A cutting operation (e.g. a half-cut operation) is performed to remove a portion of the sacrificial structure 20 as shown in FIG. 4D. A cutting operation (e.g. a half-cut operation) is performed to remove a portion of the protection layer 13 as shown in FIG. 4D to form a step structure 13a. A cutting operation (e.g. a half-cut operation) is performed by a cutting tool 30, e.g. a blade, a knife or other suitable tools.

A top surface of the sacrificial structure 20 is substantially coplanar with a top surface of the wall 11a. A top surface of the step structure 13a is substantially coplanar with a top surface of the wall 11a.

Figure 4F:
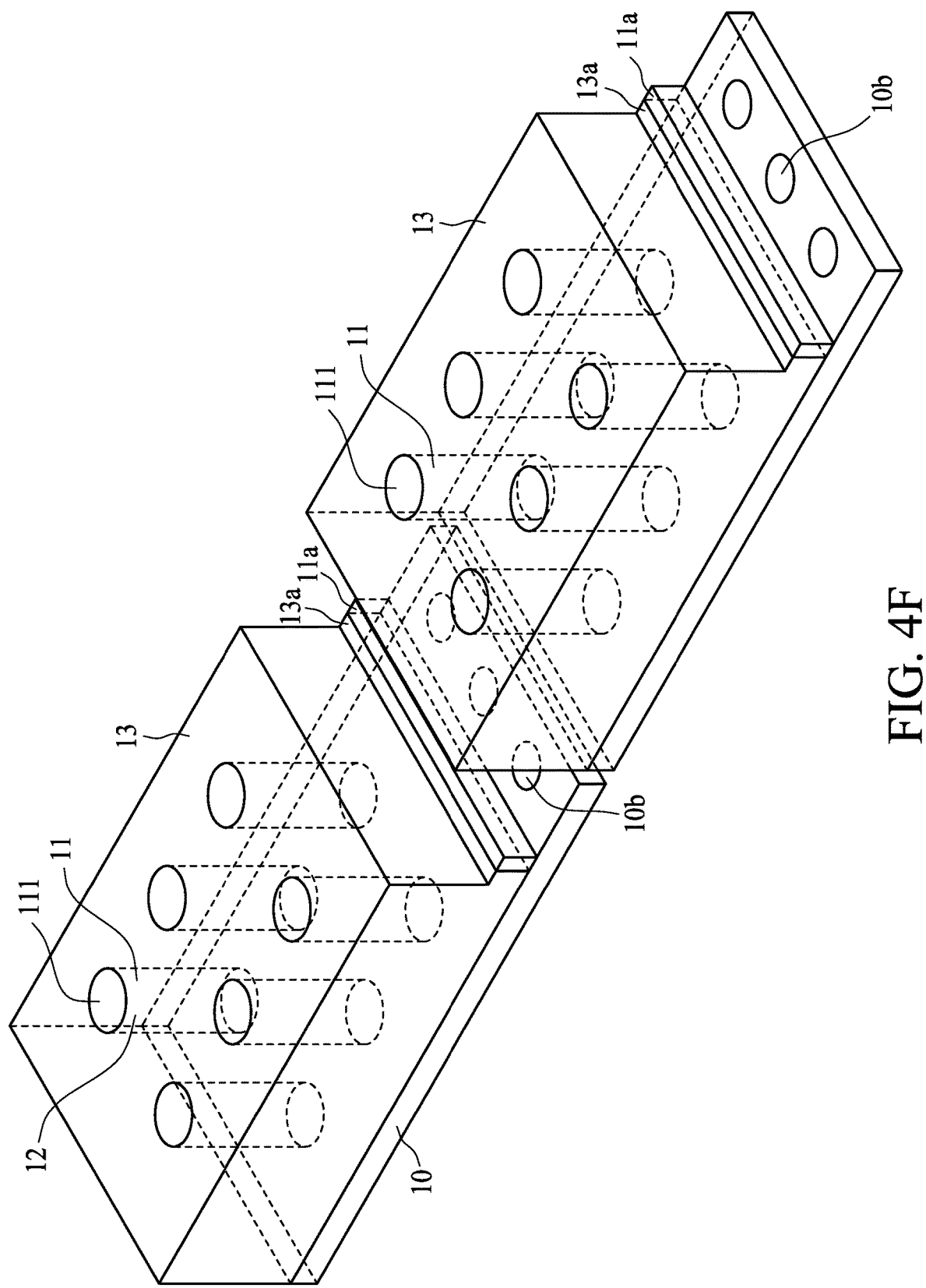

FIG. 4F illustrates one or more stages of a method for manufacturing a semiconductor device package in accordance with some embodiments of the subject application. The sacrificial structure 20 in the wall 11a as shown in FIG. 4E is removed by a solvent or solution. The whole sacrificial structure 20 in the wall 11a as shown in FIG. 4E is removed by a solvent or solution. The sacrificial structure 20 in the wall 11a as shown in FIG. 4E is removed to expose the conductive/bonding pads 10b of the semiconductor device 10.

A singulation operation is performed along the scribe lines S as shown in FIG. 3. A singulation operation is performed by cutting technique. A singulation operation is performed by a tool 41 as shown in FIG. 4E along a scribe lines S to separate a semiconductor device 10 from other semiconductor devices 10. A singulation operation is performed by a tool 42 as shown in FIG. 4E along another scribe lines S to separate a semiconductor device 10 from other semiconductor devices 10. A singulation operation is performed by a tool 43 as shown in FIG. 4E along another scribe lines S to separate a semiconductor device 10 from other semiconductor devices 10. A singulation operation is performed by a tool 44 as shown in FIG. 4E along another scribe lines S to separate a semiconductor device 10 from other semiconductor devices 10. A singulation operation is performed to form a number of semiconductor device packages 1a as shown in FIG. 1A. Each of the tools 41, 42, 43 and 44 as shown in FIG. 4E may include but is not limited to a blade, a knife or other suitable tools. It is contemplated that a width of the each of the tools 41, 42, 43 and 44 as shown in FIG. 4E may be changed in other embodiments of the subject application.

Figure 5A:
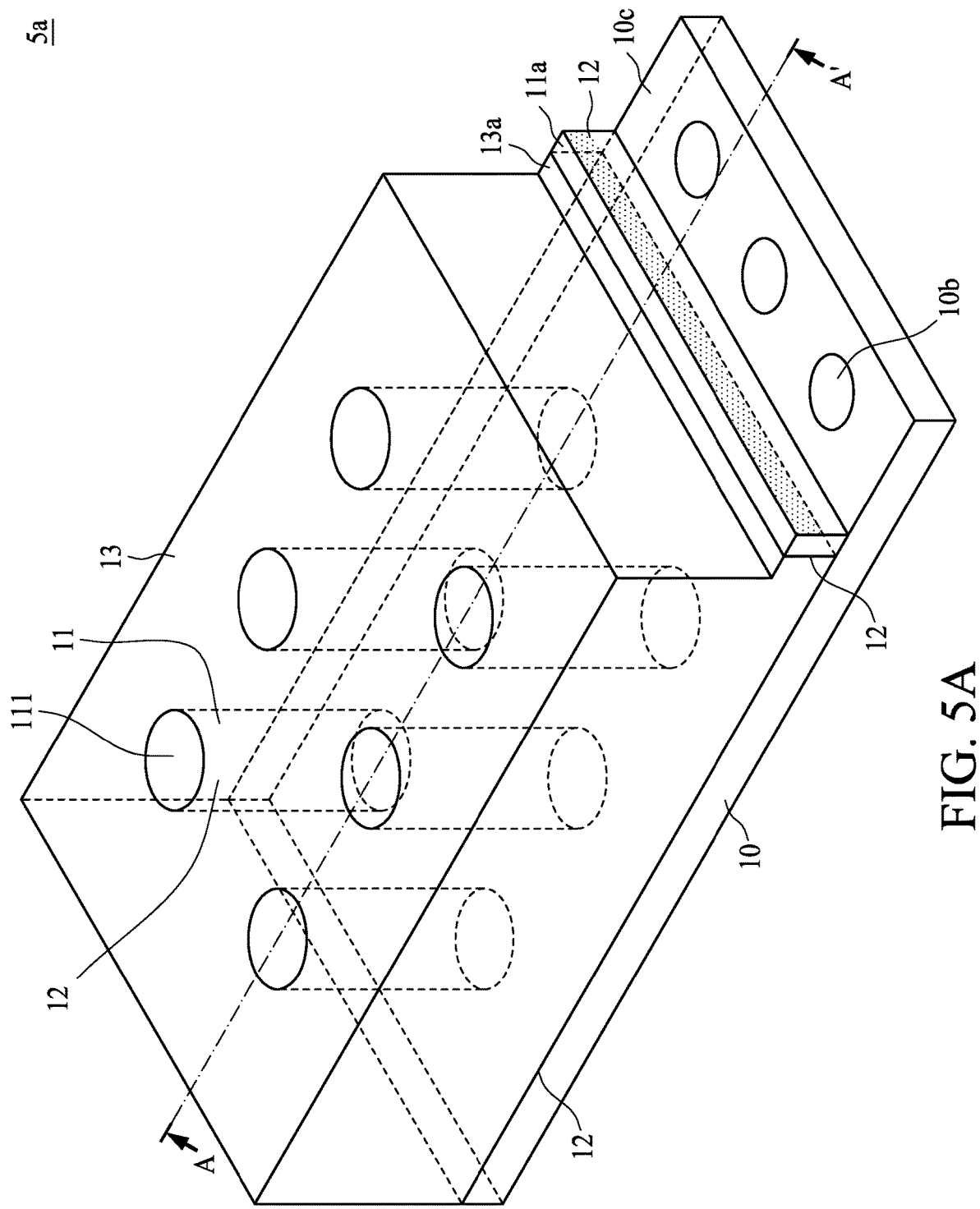
FIG. 5A illustrates a perspective view of a semiconductor device package in accordance with some embodiments of the subject application.

FIG. 5A illustrates a perspective view of a semiconductor device package 5a in accordance with some embodiments of the subject application. The semiconductor device package 5a is similar to the semiconductor device package 1a as described and illustrated with reference to FIG. 1A, except that an opaque layer 12 is disposed on a portion of a surface of the wall 11a, and the surface of the wall 11a is opposite to the step structure 13a.

Figure 5B:
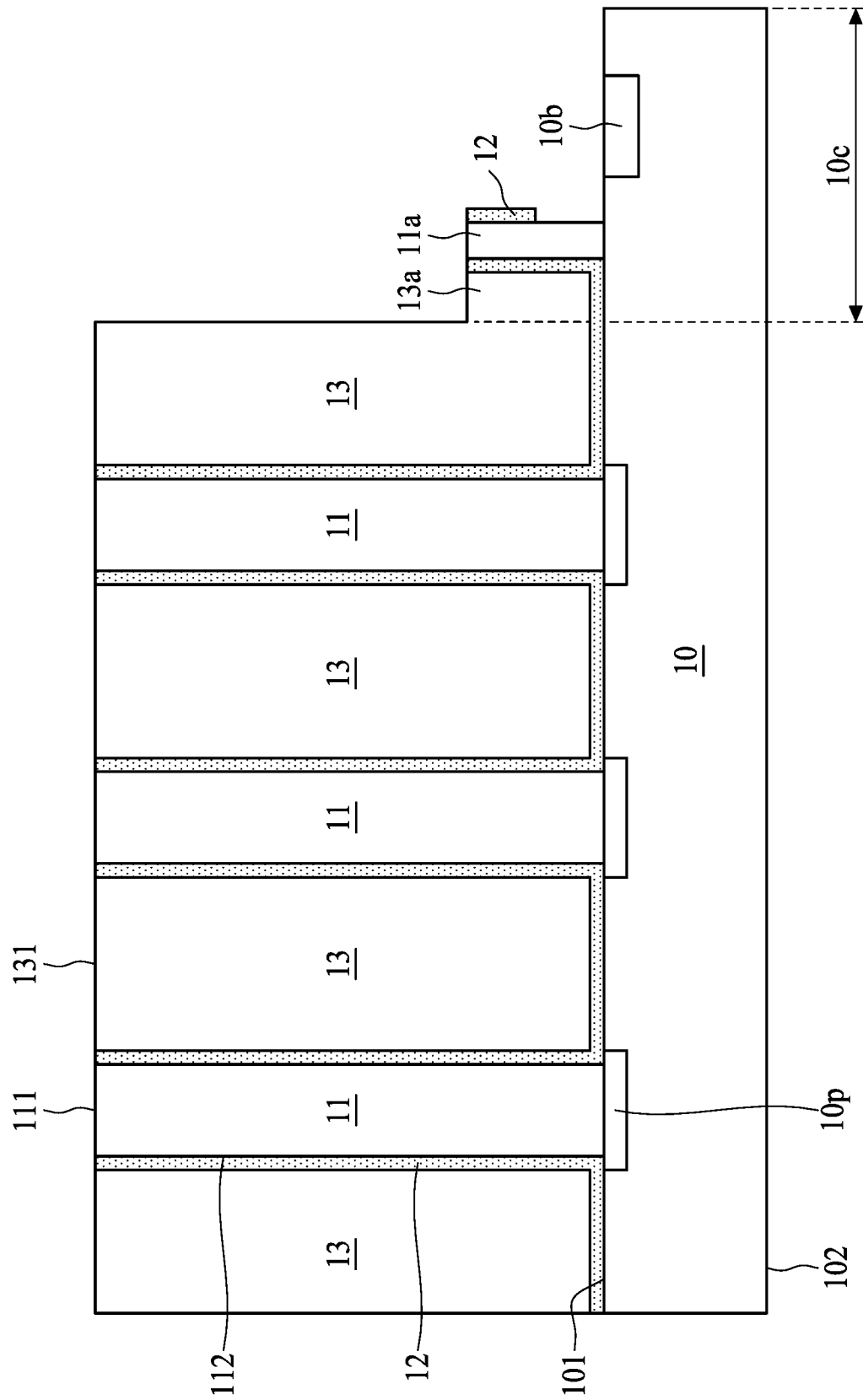
FIG. 5B illustrates a cross-sectional view of the semiconductor device package across a line AA' as shown in FIG. 5A.

FIG. 5B illustrates a cross-sectional view of the semiconductor device package 5a across a line AA' as shown in FIG. 5A.

The opaque layer 12 may be disposed on a portion of a surface of the wall 11a, and the surface of the wall 11a is opposite the step structure 13a. The opaque layer 12 on a portion of the surface of the wall 11a is separated from and not in direct contact with the semiconductor device 10.

Figure 5C:
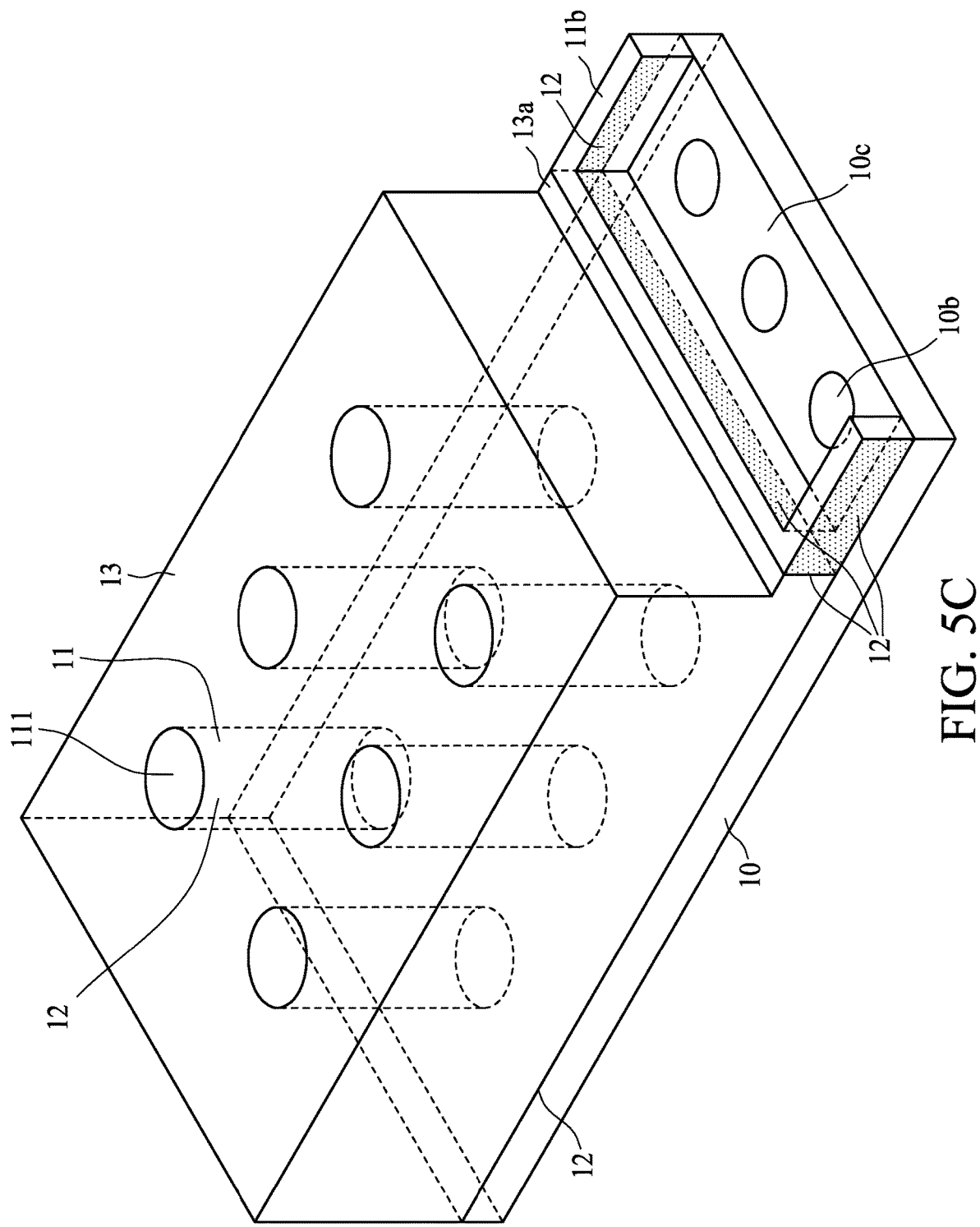
FIG. 5C illustrates a perspective view of a semiconductor device package in accordance with some embodiments of the subject application.

FIG. 5C illustrates a perspective view of a semiconductor device package 5c in accordance with some embodiments of the subject application. The semiconductor device package 5c is similar to the semiconductor device package 1a as described and illustrated with reference to FIG. 1A, except that the wall 11a is replaced by a wall 11b. The opaque layer 12 is disposed between the wall 11b and the step structure 13a. The opaque layer 12 is disposed on three outer surfaces (not denoted in FIG. 5C) of the wall 11b.

The opaque layer 12 is disposed on a portion of three inner surfaces (not denoted in FIG. 5C) of the wall 11b. The top surface of the wall 11b is exposed by the opaque layer 12.

Figure 6A:
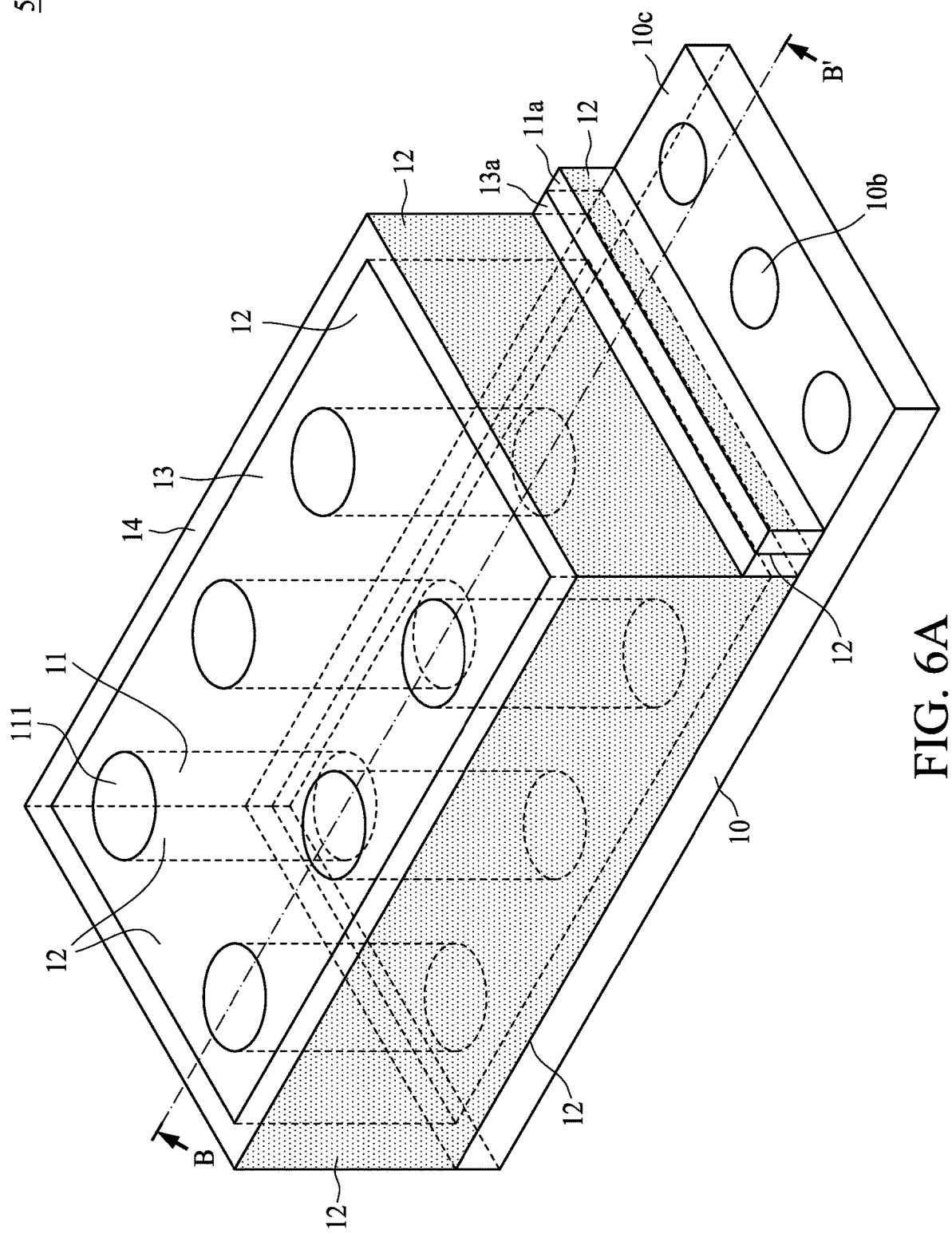
FIG. 6A illustrates a perspective view of a semiconductor device package in accordance with some embodiments of the subject application.

FIG. 6A illustrates a perspective view of a semiconductor device package in accordance with some embodiments of the subject application. The semiconductor device package 5b is similar to the semiconductor device package 1a as described and illustrated with reference to FIG. 1A, except that a periphery of the protection layer 13 as shown in FIG. 1A is replaced by a wall 14. The protection layer 13 is separated from the wall 13a by the wall 14.

The wall 14 may include material similar or same to the material of the optical conductive pillar 11. The wall 14 may include material different from the material of the optical conductive pillar 11. The wall 14 may be adjacent to the wall 13a. The wall 14 surrounds the protection layer 13. The wall 14 surrounds the optical conductive pillars 11. The wall 14 is disposed on the semiconductor device 10. The wall 14 is in direct contact with the semiconductor device 10.

The opaque layer 12 is disposed on the outer side surfaces of the wall 14. The opaque layer 12 is disposed on the inner side surfaces of the wall 14. The wall 14 has a top surface or upper surface which is coplanar with the top surface 131 of the protection layer 13. The opaque layer 12 is disposed on a portion of a surface of the wall 11a, and the surface of the wall 11a is opposite to the step structure 13a.

Figure 6B:
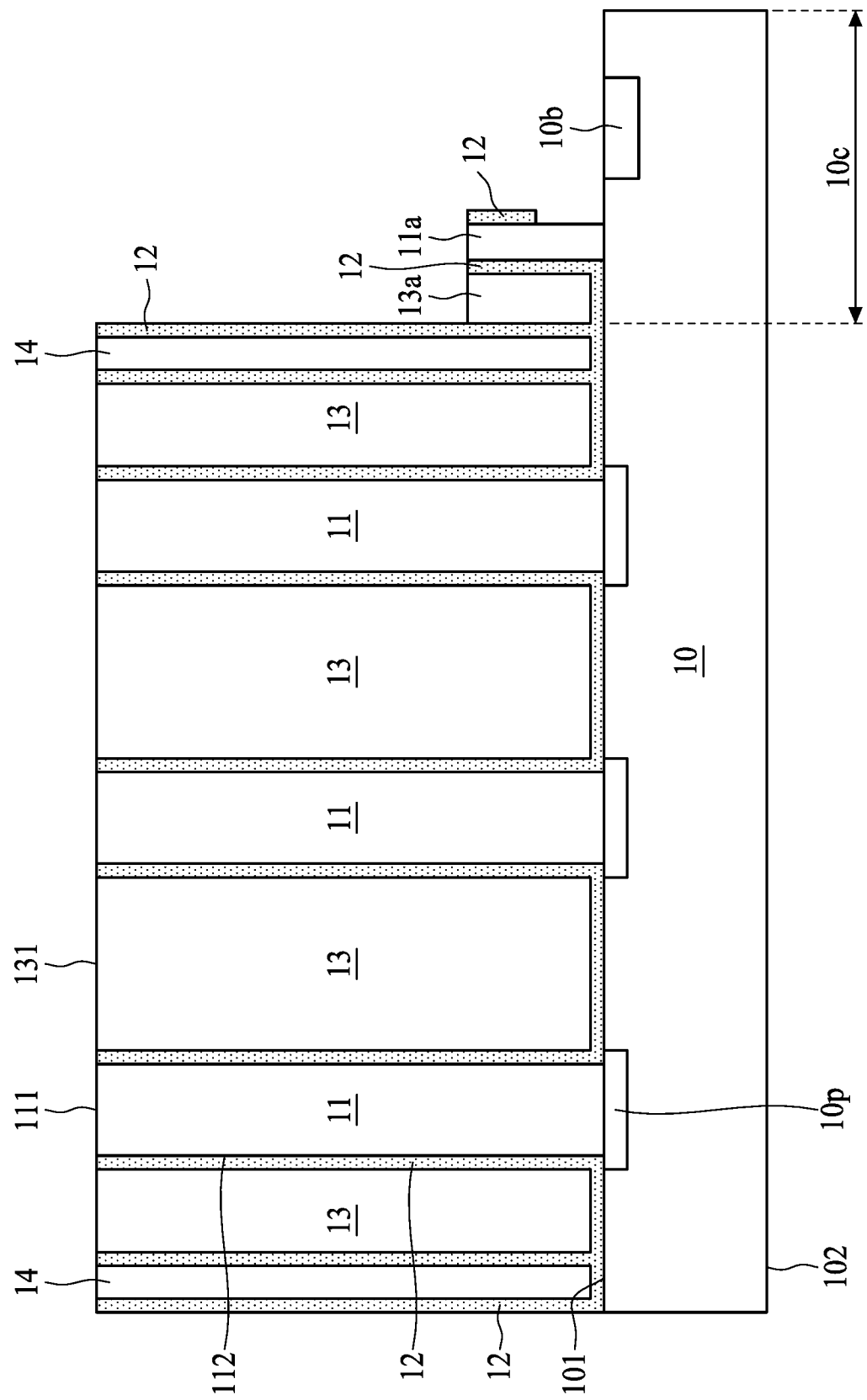
FIG. 6B illustrates a cross-sectional view of the semiconductor device package across a line BB' as shown in FIG. 6A.

FIG. 6B illustrates a cross-sectional view of the semiconductor device package 6b across a line BB' as shown in FIG. 6A.

Figure 6C:
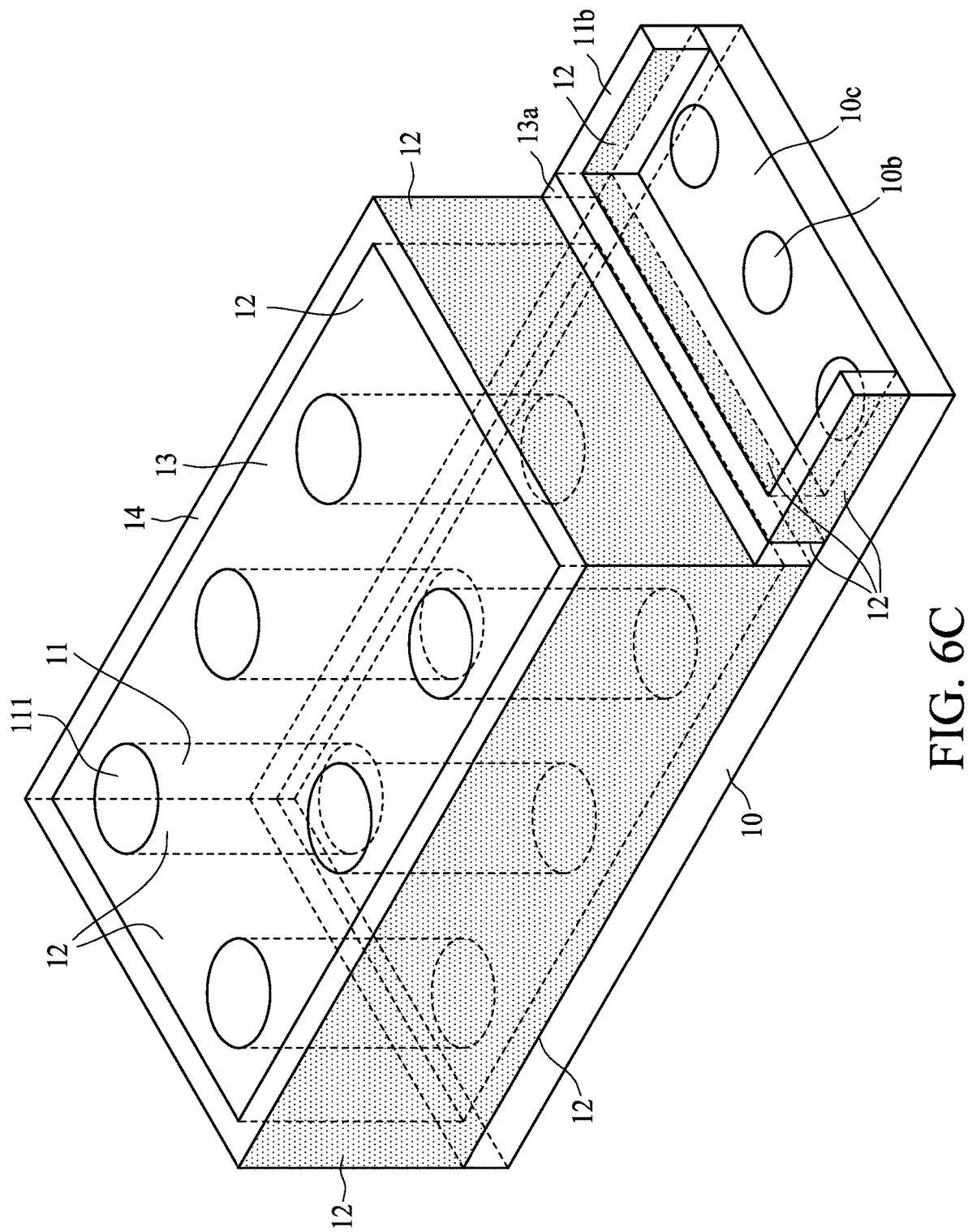
FIG. 6C illustrates a perspective view of a semiconductor device package in accordance with some embodiments of the subject application.

FIG. 6C illustrates a perspective view of a semiconductor device package in accordance with some embodiments of the subject application. The semiconductor device package 5d is similar to the semiconductor device package 1b as described and illustrated with reference to FIG. 2A, except that the wall 11a is replaced by a wall 11b.

Figure 7A:
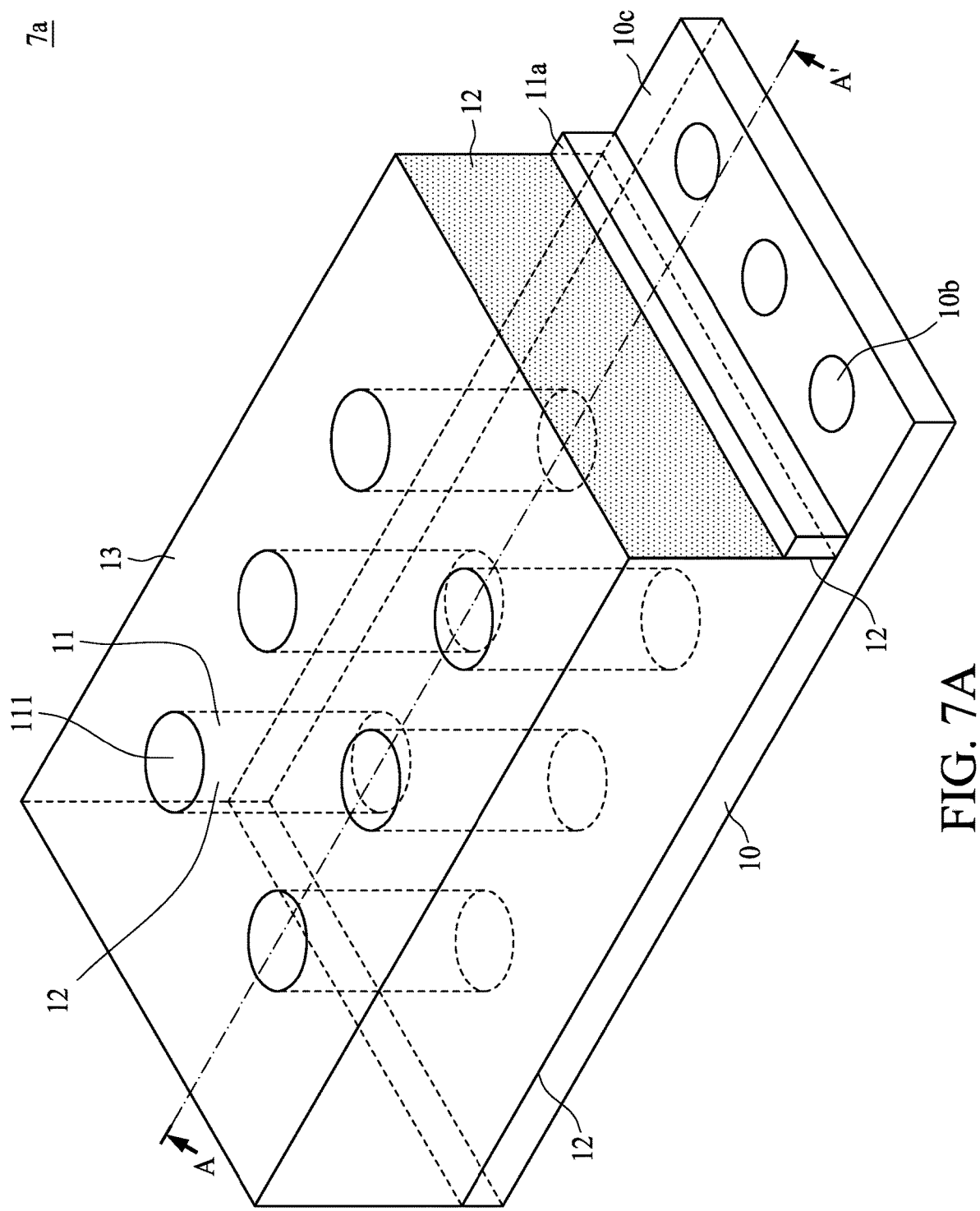
FIG. 7A illustrates a perspective view of a semiconductor device package in accordance with some embodiments of the subject application.

FIG. 7A illustrates a perspective view of a semiconductor device package in accordance with some embodiments of the subject application. The semiconductor device package 7a is similar to the semiconductor device package 1a as described and illustrated with reference to FIG. 1A, except that the protection layer 13 does not include a step structure 13a. The opaque layer 12 is disposed on the outer side surfaces of the protection layer 13. A portion of the opaque layer 12 is covered by the wall 11a.

Figure 7B:
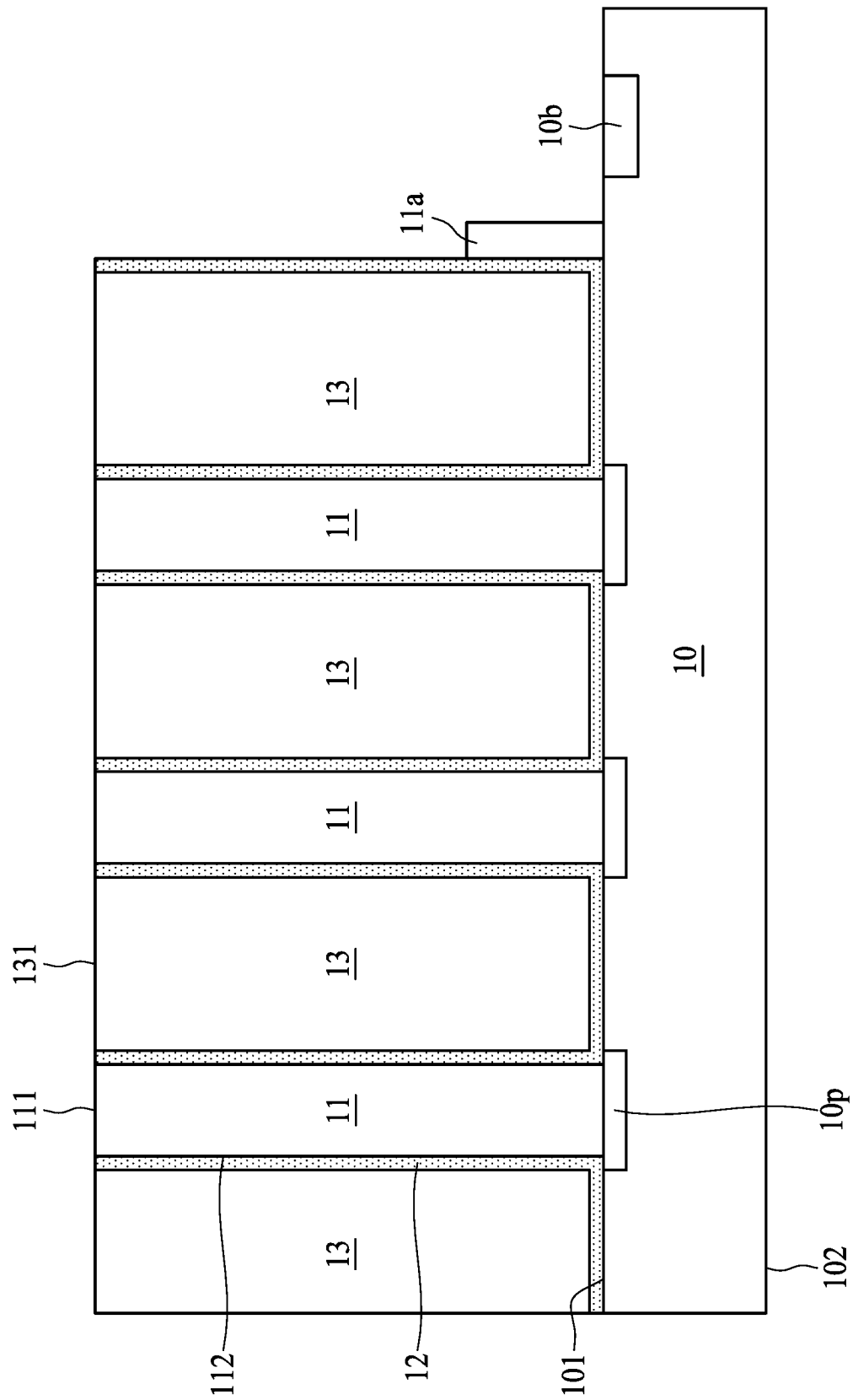
FIG. 7B illustrates a cross-sectional view of the semiconductor device package across a line BB' as shown in FIG. 7A.

FIG. 7B illustrates a cross-sectional view of the semiconductor device package 7a across a line BB' as shown in FIG. 7A.

Figure 8A:
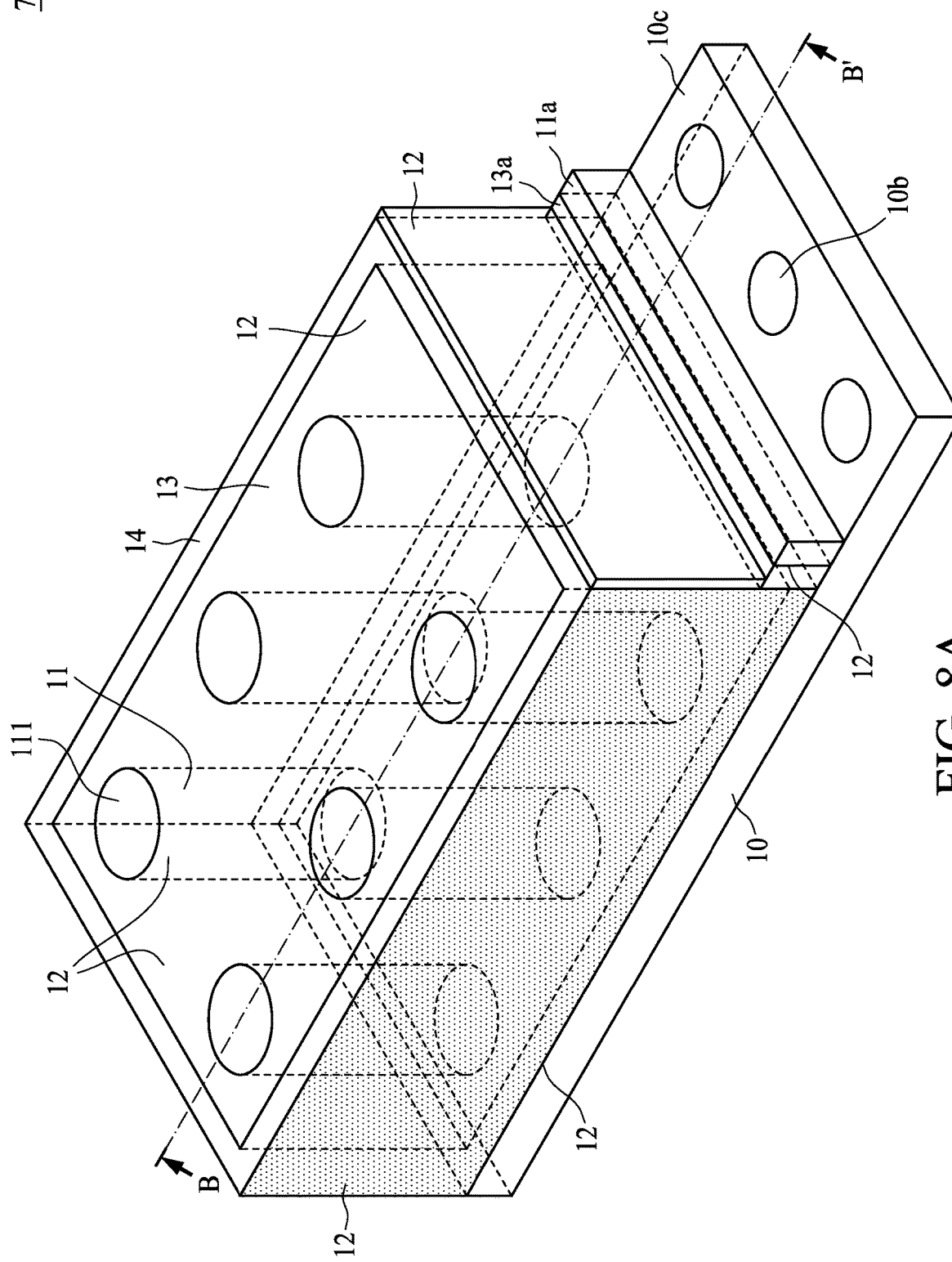
FIG. 8A illustrates a perspective view of a semiconductor device package in accordance with some embodiments of the subject application.

FIG. 8A illustrates a perspective view of a semiconductor device package in accordance with some embodiments of the subject application. The semiconductor device package 7b is similar to the semiconductor device package 1b as described and illustrated with reference to FIG. 2A, except that a step structure 13a. The step structure 13a is disposed on the outer surface of the wall 14. The thickness of the lower portion of the step structure 13a is substantially the same as the thickness of the wall 11a. The opaque layer 12 is disposed between the step structure 13a and the wall 11a.

Figure 8B:
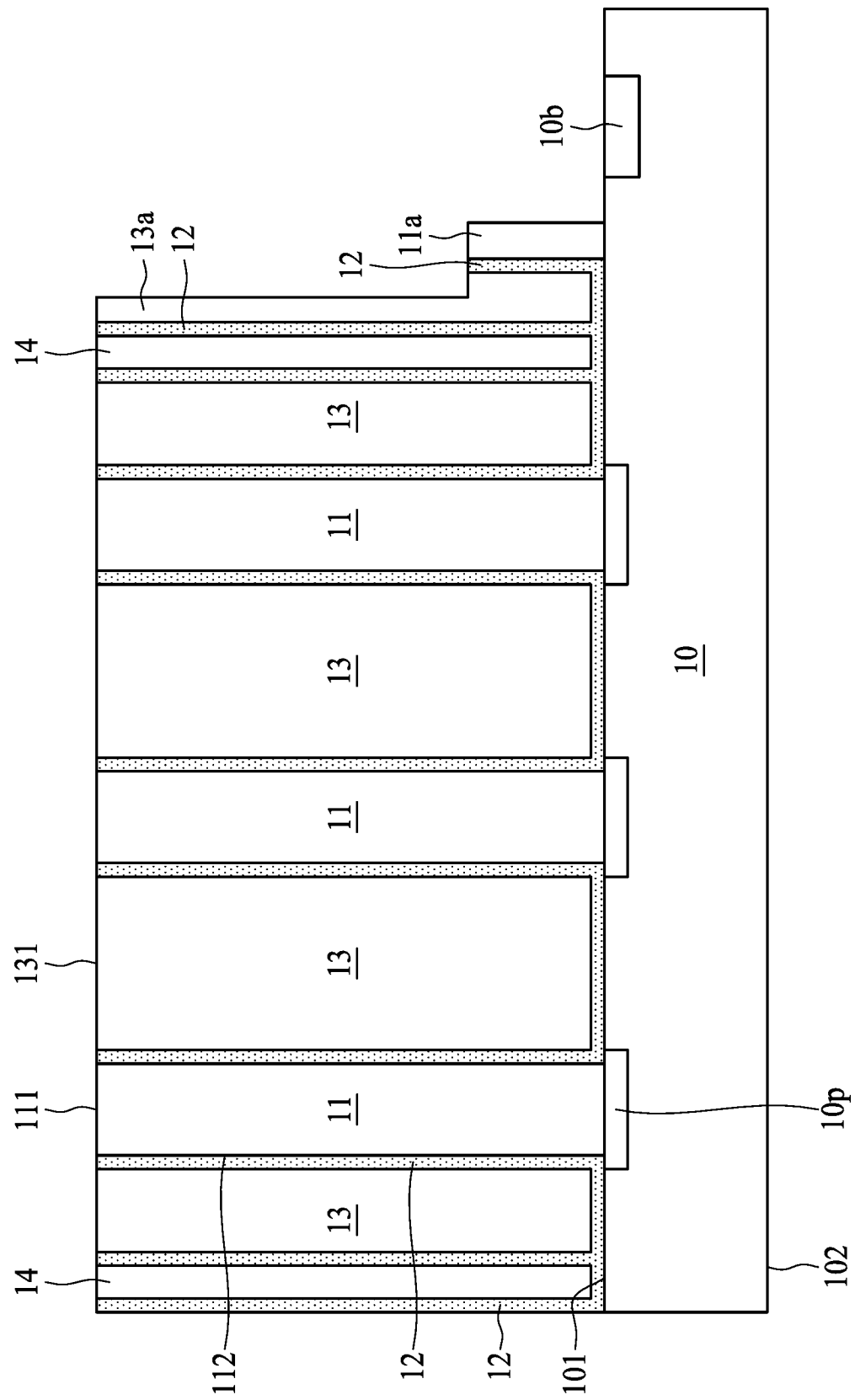
FIG. 8B illustrates a cross-sectional view of the semiconductor device package across a line BB' as shown in FIG. 8A.

FIG. 8B illustrates a cross-sectional view of the semiconductor device package 7b across a line BB' as shown in FIG. 8A.

Figure 9A:
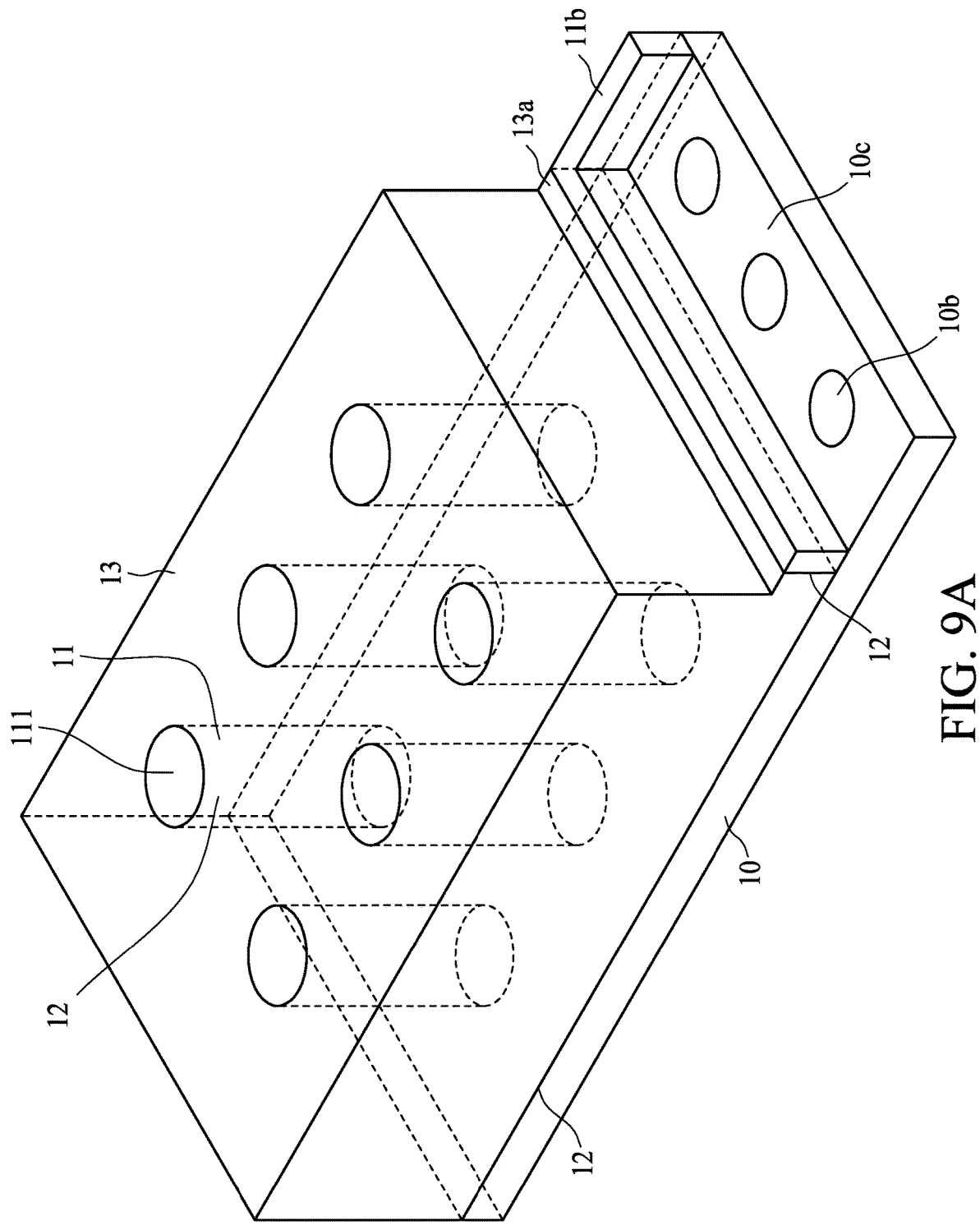
FIG. 9A illustrates a perspective view of a semiconductor device package in accordance with some embodiments of the subject application.

FIG. 9A illustrates a perspective view of a semiconductor device package in accordance with some embodiments of the subject application. The semiconductor device package 9a is similar to the semiconductor device package 1c as described and illustrated with reference to FIG. 1C, except that the wall 11b includes two continuous portions. The opaque layer 12 is disposed between the wall 11b and the step structure 13a. The top surface of the wall 11b is exposed by the opaque layer 12. The wall 11b includes three continuous portions (not denoted on FIG. 9A) before the singulation operation. The two continuous portions of the wall 11b are formed by the singulation operation since the semiconductor device package 9a is disposed on the periphery of the wafer W and one of the three continuous portions is cut.

Figure 9B:
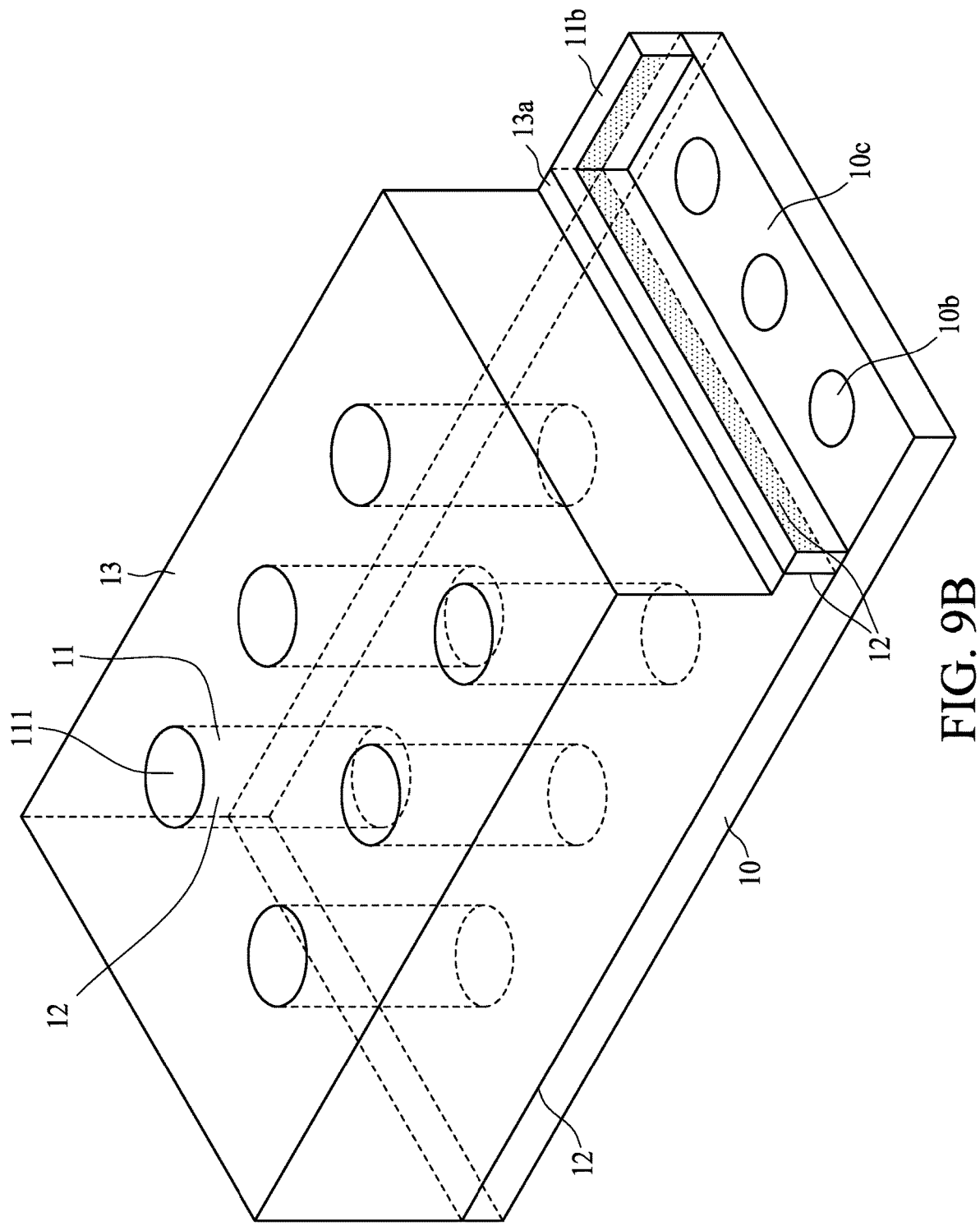
FIG. 9B illustrates a perspective view of a semiconductor device package in accordance with some embodiments of the subject application.

FIG. 9B illustrates a perspective view of a semiconductor device package in accordance with some embodiments of the subject application. The semiconductor device package 9b is similar to the semiconductor device package 9a as described and illustrated with reference to FIG. 9A, except that an opaque layer 12 is disposed on a portion of an outer surface of the wall 11a, and the outer surface of the wall 11a is opposite to the step structure 13a.

As used herein, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

For example, two surfaces can be deemed to be coplanar or substantially coplanar if a displacement between the two surfaces is equal to or less than 5 µm, equal to or less than 2 µm, equal to or less than 1 µm, or equal to or less than 0.5 µm. A surface can be deemed to be planar or substantially planar if a displacement of the surface relative to a flat plane between any two points on the surface is equal to or less than 5 µm, equal to or less than 2 µm, equal to or less than 1 µm, or equal to or less than 0.5 µm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

Spatial descriptions, such as "above," "below," "up," "left," "right," "down," "top," "bottom," "vertical," "horizontal," "side," "higher," "lower," "upper," "over," "under," "downward," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such arrangement While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device package, comprising:
a semiconductor device including a pixel;
an optical conductive pillar on the pixel;
an encapsulant comprising a first portion having a first thickness and encapsulating the optical conductive pillar and a second portion having a second thickness different from the first thickness; and
a first opaque layer and a wall, wherein the first opaque layer is disposed between the encapsulant and the wall.

2. The semiconductor device package of claim 1, wherein the first portion and the second portion form a step structure.

3. The semiconductor device package of claim 1, wherein the encapsulant comprises material different from the wall.

4. The semiconductor device package of claim 1, wherein the material of the optical conductive pillar is the same as the material of the wall.

5. The semiconductor device package of claim 1, wherein the optical conductive pillars include collimators.

6. The semiconductor device package of claim 1, further comprising a second opaque layer disposed on a sidewall of the wall and separated from the semiconductor device.

7. The semiconductor device package of claim 1, wherein the wall is transparent.

8. A semiconductor device package, comprising:
a semiconductor device including a pixel;
an optical conductive pillar on the pixel;
an encapsulant having a first thickness and encapsulating the optical conductive pillar; and
a wall having a second thickness different from the first thickness, wherein the material of the optical conductive pillar is the same as the material of the wall.

9. The semiconductor device package of claim 8, wherein the encapsulant includes a step structure having the second thickness.

10. The semiconductor device package of claim 8, further comprising a first opaque layer disposed between the encapsulant and the wall.

11. The semiconductor device package of claim 8, wherein the material of encapsulant is different from the material of the wall.

12. The semiconductor device package of claim 8, wherein the optical conductive pillars include collimators.

13. The semiconductor device package of claim 10, further comprising a second opaque layer disposed on a sidewall of the wall and separated from the semiconductor device.

14. The semiconductor device package of claim 8, wherein the wall is transparent.

15. The semiconductor device package of claim 10, wherein the top surface of the first opaque layer is coplanar with the top surface of the wall.

16. A method for manufacturing a semiconductor device package, comprising:
providing a semiconductor device including a pixel;
disposing an optical conductive pillar on the pixel;
forming an encapsulant having a first thickness, wherein the encapsulant encapsulates the optical conductive pillar; and
forming a wall having a second thickness different from the first thickness, wherein the step structure and the wall are formed by using a cutting operation and removing a portion of a sacrificial structure.

17. The method of claim 16, wherein the encapsulant includes a step structure having the second thickness.

* * * * *